(12) United States Patent
Ono

(10) Patent No.: US 10,524,325 B2
(45) Date of Patent: Dec. 31, 2019

(54) LIGHT EMITTING DEVICE AND ILLUMINATION DEVICE

(71) Applicant: SHARP KABUSHIKI KAISHA, Sakai, Osaka (JP)

(72) Inventor: Tsuyoshi Ono, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/304,286

(22) PCT Filed: May 11, 2017

(86) PCT No.: PCT/JP2017/017849
§ 371 (c)(1),
(2) Date: Nov. 25, 2018

(87) PCT Pub. No.: WO2017/203989
PCT Pub. Date: Nov. 30, 2017

(65) Prior Publication Data
US 2019/0098719 A1    Mar. 28, 2019

(30) Foreign Application Priority Data

May 26, 2016   (JP) .................. 2016-105412

(51) Int. Cl.
*H05B 37/00* (2006.01)
*H05B 39/00* (2006.01)
(Continued)

(52) U.S. Cl.
CPC ..... *H05B 33/0857* (2013.01); *H01L 25/0753* (2013.01); *H05B 33/0815* (2013.01);
(Continued)

(58) Field of Classification Search
None
See application file for complete search history.

(56) References Cited

U.S. PATENT DOCUMENTS 8,884,555 B2 * 11/2014 Nagumo ............ H05B 33/0842
    315/313
2011/0249431 A1    10/2011 Tanaka
(Continued)

FOREIGN PATENT DOCUMENTS

JP    2011-222723 A    11/2011
JP    2015-056379 A    3/2015
(Continued)

*Primary Examiner* — Anh Q Tran
(74) *Attorney, Agent, or Firm* — ScienBiziP, P.C.

(57) ABSTRACT

To provide an illumination device that has light emitting diodes as light sources and is capable of switching emission colors and of performing dimming in each of the emission colors, an illumination device includes plural light emitting units in which at least one light emitting diode is disposed, the other light emitting units than the light emitting unit whose forward voltage is a maximum are provided with a switching element that is connected in series with the light emitting diode, and the other light emitting units than the light emitting unit whose forward voltage is a minimum are provided with an element that is connected in series with the light emitting diode and has a resistance.

9 Claims, 8 Drawing Sheets

(51) Int. Cl.
  *H05B 41/00* (2006.01)
  *H05B 33/08* (2006.01)
  *H05B 37/02* (2006.01)
  *H01L 25/075* (2006.01)
  *H01L 33/54* (2010.01)
  *H01L 33/62* (2010.01)

(52) U.S. Cl.
  CPC ......... *H05B 33/0827* (2013.01); *H05B 37/02* (2013.01); *H01L 33/54* (2013.01); *H01L 33/62* (2013.01)

(56) References Cited

U.S. PATENT DOCUMENTS

2012/0235574 A1* 9/2012 Sumi .................. H05B 33/0887
  315/131
2015/0077002 A1   3/2015 Takahashi et al.
2017/0307174 A1* 10/2017 Sumitani .................. F21V 19/00

FOREIGN PATENT DOCUMENTS

| JP | 2015-122202 A | 7/2015 |
| JP | 5775996 B2 | 9/2015 |
| WO | 2016/047242 A1 | 3/2016 |

* cited by examiner

LIGHT EMITTING DEVICE AND ILLUMINATION DEVICE

TECHNICAL FIELD

The present invention relates to a light emitting device that includes a light emitting element such as a light emitting diode (LED) and an illumination device that uses a light emitting device.

BACKGROUND ART

In recent years, a light emitted diode (LED) with low power consumption and long life has been attracting attention, and an illumination device which has an LED as a light source has often been used instead of an illumination device in related art that has an incandescent light bulb as a light source. In the illumination device that has an LED as the light source, an illumination device has been suggested which is capable of dimming for changing beams and of toning for changing emission colors (for example, see PTLs 1 to 4 and so forth).

In an illumination device of PTL 1, current is supplied from a power source unit to plural light sources (white light and incandescent-lamp color light) with different emission colors, in the power source unit, two step-down chopper circuits are connected in parallel with an output end of a boost chopper circuit, and an LED unit of white light and an LED unit of incandescent-lamp color light are respectively connected with the step-down choppers. In addition, a current is independently supplied to each of the LED unit of the white color light and the LED unit of the incandescent-lamp color light, and dimming and toning are thereby performed.

A light emitting device in PTL 2 includes a first LED and a second LED that have different emission colors and are connected in parallel with each other, and a resistance which is in series connected with the first LED is provided. In addition, the voltage is changed by using differences in the change characteristic between a forward current of the first LED and the forward current of the second LED in a case where a power source voltage is changed, the ratio between a beam emitted from the first LED and a beam emitted from the second LED in all the beams is thereby changed, and dimming and toning are simultaneously performed.

An illumination device of PTL 3 includes a first light emitting unit and a second light emitting unit with different emission colors and includes a switching element that is disposed in series with the second light emitting unit on a second current path through which current flows to the second light emitting unit. In addition, ON and OFF of the switching element are switched in accordance with a signal from a selection control circuit, and to which of the first light emitting unit and the second light emitting unit the current flows is thereby selected. Accordingly, toning is performed.

An LED illumination device of PTL 4 includes plural LED groups in which plural LEDs are directly connected together in a forward direction. The plural LED groups have different total forward voltages, which are the totals of forward voltages of the plural LEDs. In the LED groups other than the LED group that has the maximum total forward voltage, a switching element connected in series is connected in series with the plural LEDs. In addition, the switching element is turned ON or OFF by a control signal from a control unit, and the current is thereby selectively caused to flow through any of the plural LED groups. Accordingly, dimming or toning is performed.

CITATION LIST

Patent Literature

PTL 1: Japanese Patent Application No. 5775996
PTL 2: Japanese Unexamined Patent Application Publication No. 2011-222723
PTL 3: Japanese Unexamined Patent Application Publication No. 2015-56379
PTL 4: Japanese Unexamined Patent Application Publication No. 2015-122202

SUMMARY OF INVENTION

Technical Problem

However, in a case of a light emitting device disclosed in PTL 2, the ratios of a beam of a first light emitting diode and a beam of a second light emitting diode to all beams change in accordance with the change in voltage, and a color temperature simultaneously changes in accordance with the change in the beams. That is, dimming may not be performed with respect to each color temperature.

In the illumination device disclosed in PTL 2, beams of an LED unit of white light and an LED unit of incandescent-lamp color light are individually adjustable, and such a configuration is capable of toning and dimming. However, a step-down chopper circuit is requested for each of the LED units, the circuit configuration is complicated, and costs become high. Further, size reduction is difficult.

Illumination devices disclosed in PTL 3 and PTL 4, a switching element is disposed in order to supply a current to each light source unit, the beam of each of the light source units is adjusted by ON or OFF of the switching element, and dimming is thereby performed. However, a control unit for outputting a control signal to the switching element is requested, the circuit configuration of a power source unit is complicated, and costs become high. Further, size reduction is difficult.

Accordingly, an object of the present invention is to provide an illumination device that has a light emitting diode as a light source, is small in size with a simple configuration, is capable of switching emission colors, and is capable of performing dimming in each emission color.

Solution to Problem

To achieve the above object, a light emitting device according to the present invention includes plural light emitting units in which at least one light emitting diode is disposed. The plural light emitting units respectively have different emission colors and forward voltages. The other light emitting units than the light emitting unit whose forward voltage is a maximum are provided with a switching element that is connected in series with the light emitting diode, and the other light emitting units than the light emitting unit whose forward voltage is a minimum are provided, on a negative electrode side, with an element that is connected in series with the light emitting diode and has a resistance. The switching element is an element that includes a first terminal, a second terminal, and a third terminal, causes the first terminal and the second terminal to turn into a conducting state by applying a prescribed voltage to the third terminal, and subsequently retains the conducting state in a case where a voltage of the third terminal is within a specific range. A terminal on a positive electrode side of the element that has the resistance is electrically connected with the third terminal of the switching element that is provided to the light emitting unit whose forward voltage is highest among the light emitting units whose forward voltages are lower than the light emitting unit that is provided with the element which has the resistance.

Such a configuration turns ON the switching element by changing the supplied current, thereby switches light emission by the light emission units, and adjusts the beams, that is, performs dimming by fluctuating the current in a range in which the switching element is not turned ON. Then, after the switching element is turned ON, the switching element is not turned OFF unless current supply is stopped. Thus, the supplied current value is appropriately adjusted, and it is thereby possible to arbitrarily change the emission colors of light emission and to perform dimming in each of the emission colors. Accordingly, a control circuit for switching the light emission and dimming is not requested, and it is thereby possible to make the light emitting device have a simple configuration. In addition, the simple configuration enables size reduction and weight saving and enables costs to be lowered.

At least one of the switching elements may be configured to include a thyristor. In such a configuration, the switching element may be provided as one element, and it is thus possible to reduce an installation area and to increase the degree of freedom of wiring.

In the above configuration, at least one of the switching elements may include a PNP junction bipolar transistor and an NPN junction bipolar transistor, a base and a collector of the PNP junction bipolar transistor may respectively be connected with a collector and a base of the NPN junction bipolar transistor, an emitter terminal of the PNP junction bipolar transistor may be the first terminal, an emitter terminal of the NPN junction bipolar transistor may be the second terminal, and a base terminal of the NPN junction bipolar transistor may be the third terminal.

In the above configuration, at least one of the plural light emitting units may include a light emitting diode group in which plural light emitting diodes are connected in series, and the light emitting unit whose forward voltage is low may have a small number of light emitting diodes that are connected in series in the light emitting diode group compared to the light emitting unit whose forward voltage is high. Because the forward voltage may be adjusted by the number of light emitting diodes, an element for adjusting the forward voltage is not requested.

In the above configuration, at least one of the plural light emitting units may include the plural light emitting diode groups, and the plural light emitting diode groups may be connected in parallel. The number of light emitting diodes that are connected in series in the light emitting diode group and the number of the light emitting diode groups that are connected in parallel are adjusted, the number of light emitting diodes of each of the light emitting units may thereby be made the same number, and the forward voltage is adjustable.

In the above configuration, the light emitting unit that includes the plural light emitting diode groups may be dividedly arranged so as to include at least one of the light emitting diode groups, and at least one of the light emitting diode groups of the different light emitting unit may be arranged between the divided light emitting units. In such a manner, the light emitting unit is dividedly arranged as individual or plural light emitting diode groups, the light emitting diode group of the other light emitting unit is arranged between the divided light emitting units, and unevenness of arrangement of the light emitting diodes of the light emitting units may thereby be suppressed. Note that the light emitting unit may be divided into individual light emitting diode groups, and between those, the light emitting diode group of the different light emitting unit may thereby be arranged. The light emitting unit may be divided so as to include plural light emitting diode groups, and between those, individual or plural light emitting diode groups of the different light emitting unit may thereby be arranged.

In the above configuration, each of the plural light emitting units includes the light emitting diode group in which a same number of light emitting diodes are connected series, at least one of the light emitting diode groups includes one or plural diodes that are connected in series with the light emitting diode, and the light emitting unit whose forward voltage is high has a large number of the connected diodes compared to the light emitting unit whose forward voltage is low. Consequently, the number of light emitting diodes of each of the light emitting units is made the same number, and the forward voltage may thereby be changed with the same or substantially same beam amount. Thus, it becomes possible to switch the emission colors and to perform dimming in each of the emission colors in a simple configuration.

In the above configuration, at least one of the elements that have the resistance may have a characteristic in which a resistance value becomes low in response to a temperature rise. In such a configuration, in a case where the voltage value at which the switching element is turned ON becomes low due to the temperature rise, the change in the voltage value due to the current may likewise be made small. Accordingly, the fluctuation in the current value at which the switching element is turned ON may be suppressed even if the temperature changes, and it is possible to make the width of dimming in each of the emission colors the same or substantially same.

The above configuration may further include: a substrate on which the plural light emitting units, the switching element, and the element which has the resistance are mounted; and land units that are respectively connected with positive electrode sides and negative electrode sides of the plural light emitting units. In such a manner, an integrated configuration in one substrate enables size reduction.

Advantageous Effects of Invention

The present invention may provide an illumination device that has a light emitting diode as a light source, is small in size with a simple configuration, is capable of switching emission colors, and is capable of performing dimming in each emission color.

DESCRIPTION OF EMBODIMENTS

Embodiments of the present invention will hereinafter be described with reference to drawings.

First Embodiment

Figure 1:
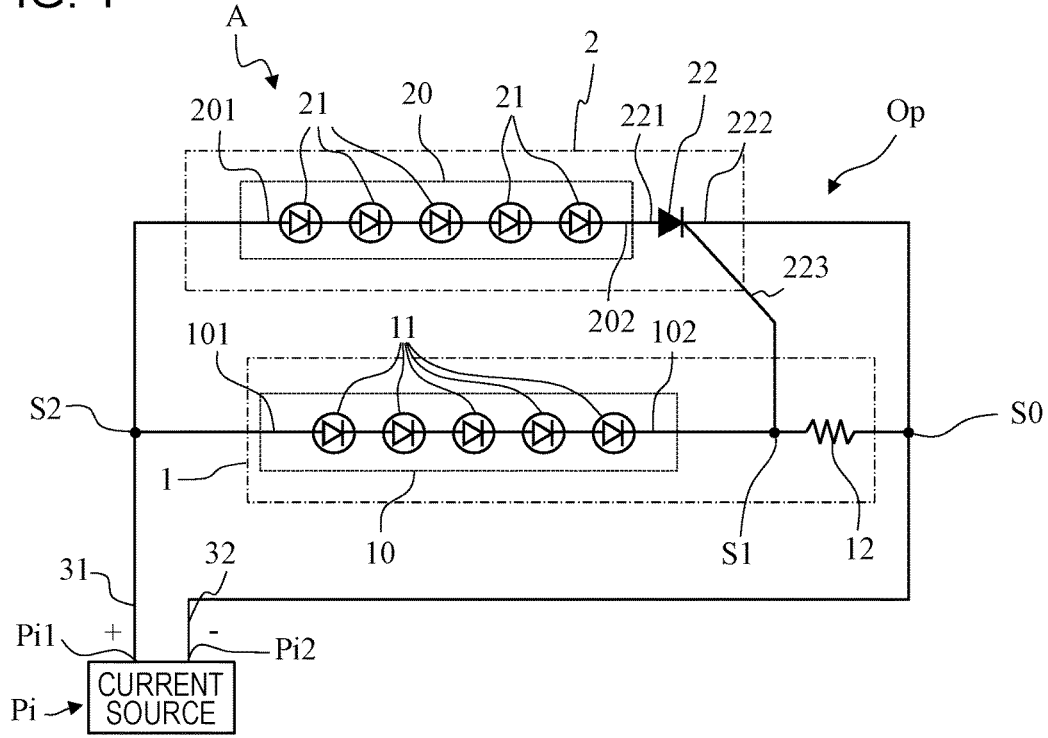
FIG. 1 is a diagram that illustrates one example of an illumination device according to the present invention.

FIG. 1 is a diagram that illustrates one example of an illumination device according to the present invention. As illustrated in FIG. 1, an illumination device A includes a current source Pi and a light emitting device Op. The light emitting device Op includes a first light emitting unit 1 and a second light emitting unit 2, and the first light emitting unit 1 and the second light emitting unit 2 are connected in parallel with the current source Pi.

The current source Pi is a power source that may supply a direct current to a connected circuit. The current source Pi has a configuration that is capable of changing a flowing current value and is also capable of keeping supplying a current of an arbitrary current value. Similarly to a common power source, the current source Pi has a configuration that may apply a voltage to a connected circuit. The current source Pi includes a positive electrode Pi1 and a negative electrode Pi2. It is assumed that in the illumination device A according to the present invention, the negative electrode Pi2 is grounded inside the current source Pi.

The first light emitting unit 1 includes plural (here, five) light emitting diodes 11 (hereinafter referred to as LED 11) and a resistance 12. Note that the number of LEDs 11 is not limited to five. For example, the number of LEDs 11 is also decided in accordance with the demanded beam amount (brightness) of the light emitting device Op, and the upper limit of the number of LEDs 11 that are connectable in series is decided in accordance with the voltage applied from the current source Pi. Further, as the resistance 12 included in the first light emitting unit 1, a resistor (resistance element) may be raised. However, the resistance 12 is not limited to a resistor. An element that has an electrical resistance (for example, a FET, a Zener diode, or the like) may be used. In the following description, simply expressed "resistance" is not limited to a resistor but includes "an element that has a (electrical) resistance". In the first light emitting unit 1, five LEDs 11 are connected in series in a forward direction. The five LEDs 11 that are connected in series in the forward direction are recognized as one set, and this one set is defined as a first LED group 10. Note that in the following description, in a case of a configuration in which the first light emitting unit 1 has one LED 11 and the resistance 12, the first LED group 10 will be interpreted as the LED 11.

The first LED group 10 is the LEDs 11 that are connected in series in the forward direction and thus has polarity, that is, has a positive electrode (anode) terminal 101 and a negative electrode (cathode) terminal 102. The positive electrode terminal 101 is connected with a first connection terminal 31 that is connected with the positive electrode Pi1 of the current source Pi. Further, the negative electrode terminal 102 is connected with a second connection terminal 32 that is connected with the negative electrode Pi1 of the current source Pi via the resistance 12.

Given that forward voltages of the LEDs 11 are Vf11 to Vf15, because the five LEDs 11 of the first LED group 10 are connected in series in the forward direction, a total forward voltage SVf1 of the first LED group 10, which is the total of the forward voltages of all the LEDs 11, may be obtained by the following formula.

$$SVf1 = Vf11 + Vf12 + Vf13 + Vf14 + Vf15$$

Note that in a case where all the forward voltages of the LEDs 11 are equivalent (Vf1), $$SVf1 = 5 \times Vf1.$$

The resistance 12 is disposed between the negative electrode terminal 102 of the first LED group 10 and the second connection terminal 32. That is, the current that flows through the first LED group 10 passes through the resistance 12 and flows to the second connection terminal 32.

The second light emitting unit 2 includes plural (here, five) light emitting diodes 21 (hereinafter referred to as LED 12) and a thyristor 22 that is a switching element. Note that the number of LEDs 21 is not limited to five. For example, the number of LEDs 21 is also decided in accordance with the demanded beam amount brightness) of the light emitting device Op, and the upper limit of the number of LEDs 21 that are connectable in series is decided in accordance with the voltage applied from the current source Pi. In the second light emitting unit 2, five LEDs 21 are connected in series in the forward direction. The five LEDs 21 that are connected in series in the forward direction are recognized as one set, and this one set is defined as a second LED group 20. Note that in the following description, in a case of a configuration in which the second light emitting unit 2 has one LED 21 and the thyristor 22, the second LED group 20 will be interpreted as the LED 21.

The second LED group 20 is the LEDs 21 that are connected in series in the forward direction and thus has polarity, that is, has a positive electrode (anode) terminal 201 and a negative electrode (cathode) terminal 202. The positive electrode terminal 201 is connected with the first connection terminal 31 that is connected with the positive electrode Pi1 of the current source Pi. Further, the negative electrode terminal 202 is connected with the second connection terminal 32 that is connected with the negative electrode Pi2 of the current source Pi via the thyristor 22.

Given that forward voltages of the LEDs 21 are Vf21 to Vf25, because the five LEDs 21 of the second LED group 20 are connected in series in the forward direction, a total forward voltage SVf2 of the second LED group 20, which is the total of the forward voltages of all the LEDs 21, may be obtained by the following formula.

$$SVf2 = Vf21 + Vf22 + Vf23 + Vf24 + Vf25$$

Note that in a case where all the forward voltages of the LEDs 21 are equivalent (Vf2), $$SVf2=5\times Vf2.$$

The light emitting device Op of the present invention causes the first light emitting unit 1 and the second emitting unit 2 to emit light while switching those, thereby switches emission colors, and performs adjustment of the beam in the switched emission color, that is, dimming. Thus, the LED 11 used for the first light emitting unit 1 and the LED 21 used for the second light emitting unit 2 are LEDs of different emission colors. For example, the LED 11 emits light in a first emission color (for example, neutral white: color temperature of approximately 5000 K), and the LED 21 emits light in a second emission color (for example, incandescent-lamp color: color temperature of approximately 3000 K). Note that the first emission color and the second emission color are examples, and emission colors are not limited to those. Further, in this embodiment, the first LED group 10 and the second LED group 20 are respective groups in which the LEDs which emit light at the same color temperature are connected in series in the forward direction, but LED groups are not limited to those. For example, LEDs of plural kinds of color temperatures are combined, and an LED group that emits light at different color temperatures may thereby be configured.

The thyristor 22 corresponds to "switching element" in claims. The thyristor 21 has an anode 221, a cathode 222, and a gate 223. The anode 221 corresponds to "first terminal" in claims, the cathode corresponds to "second terminal", and the gate 223 corresponds to "third terminal".

As illustrated in FIG. 1, the anode 221 of the thyristor 22 is connected with the negative electrode terminal 202 of the second LED group 20, and the cathode 222 of the thyristor 22 is connected with the second connection terminal 32 that is connected with the negative electrode Pi2 of the current source Pi. Further, the gate 223 of the thyristor 22 is connected with the negative electrode terminal 102 of the first LED group 10 of the first light emitting unit 1 and the resistance 12. In other words, the gate 223 is connected with the second connection terminal 32 that is connected with the negative electrode Pi2 of the current source Pi via the resistance 12.

The current flows from the anode to the cathode in the thyristor 22 by applying a voltage (referred to as trigger voltage) that is a prescribed voltage or more to the gate 223 (between the gate and the cathode) in a state where a forward voltage is applied between the anode 221 and the cathode 222. That is, the thyristor 22 turns from a non-conducting state to a conducting state, and this state change will be referred to as being turned ON. Then, the thyristor 22 that is turned ON maintains an ON state even when the voltage of the gate 223 becomes low, and the current keeps flowing.

That is, the thyristor 22 is a switching element that is turned ON when the trigger voltage is applied to the gate 223 and retains the forward current regardless of the voltage of the gate 223 after being turned ON. Then, the thyristor 22 returns to the non-conducting state in a case where the voltage between an anode 211 and the cathode 222 becomes the voltage for retaining conduction or less or a case where the forward current becomes "0". This state change will be referred to as being turned OFF.

As illustrated in FIG. 1, for an easy description, a reference point S0, a first connection point S1, and a second connection point S2 are set. The reference point S0 is at a reference voltage, is a ground point in the present invention, and is provided on wiring that is connected with the second connection terminal 32. The cathode 222 of the thyristor 22 is connected with the reference point S0. The point at which the gate 223 of the thyristor 22 is connected with the negative electrode terminal 102 of the first LED group 10 is set as the first connection point S1. The first connection point S1 is connected with the reference point S0 via the resistance 12.

For example, in a case where the current flows through the resistance 12, the first connection point S1 is at a higher voltage than the reference point S0 only by the product of the resistance value of the resistance 12 and the flowing current value. In addition, because the cathode 222 of the thyristor 22 is connected with the reference point S0 and the gate 223 is connected with the first connection point S1, a voltage is generated between the gate 223 and the cathode 222 when the current flows through the resistance 12. Note that in this embodiment, because the reference point S0 is set as the ground point and the voltage of the cathode 222 is "0", the voltage between the gate 223 and the cathode 222 may simply be referred to as gate voltage. Further, the positive electrode terminal 101 of the first LED group 10 and the positive electrode terminal 201 of the second second LED group 20 are set as a second connecting point S2, and the second connection point S2 is connected with the first connection terminal 31.

Figure 2:
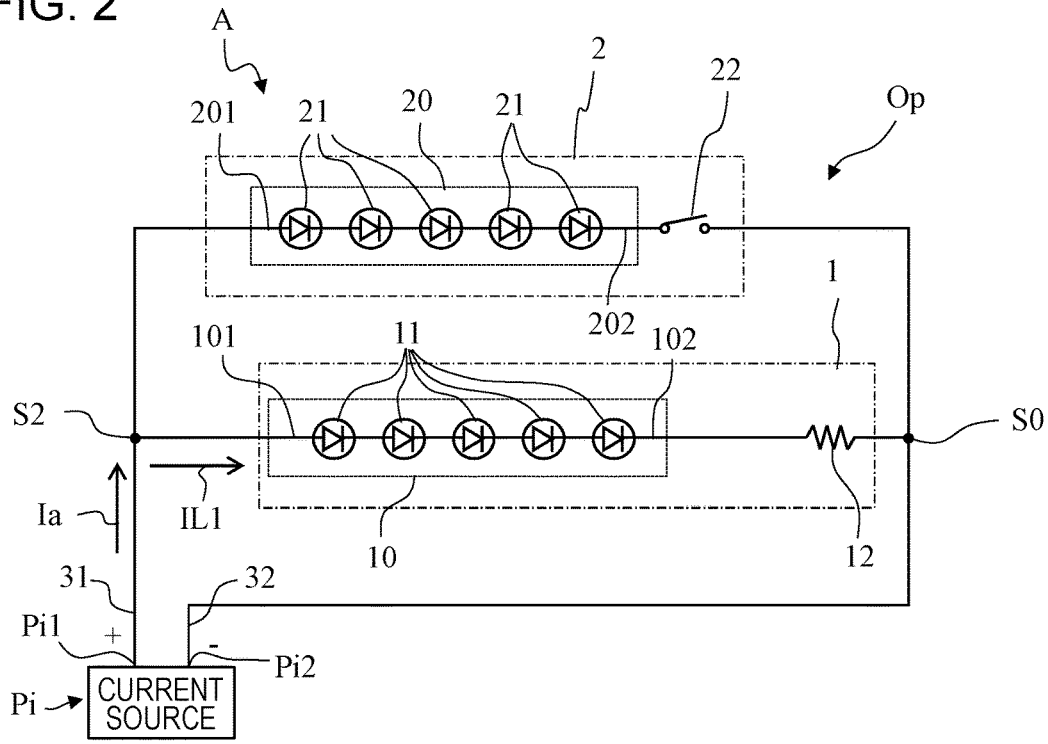
FIG. 2 is a diagram in which a thyristor in an OFF state is replaced by a switch in a circuit diagram of the illumination device illustrated in FIG. 1.
Figure 3:
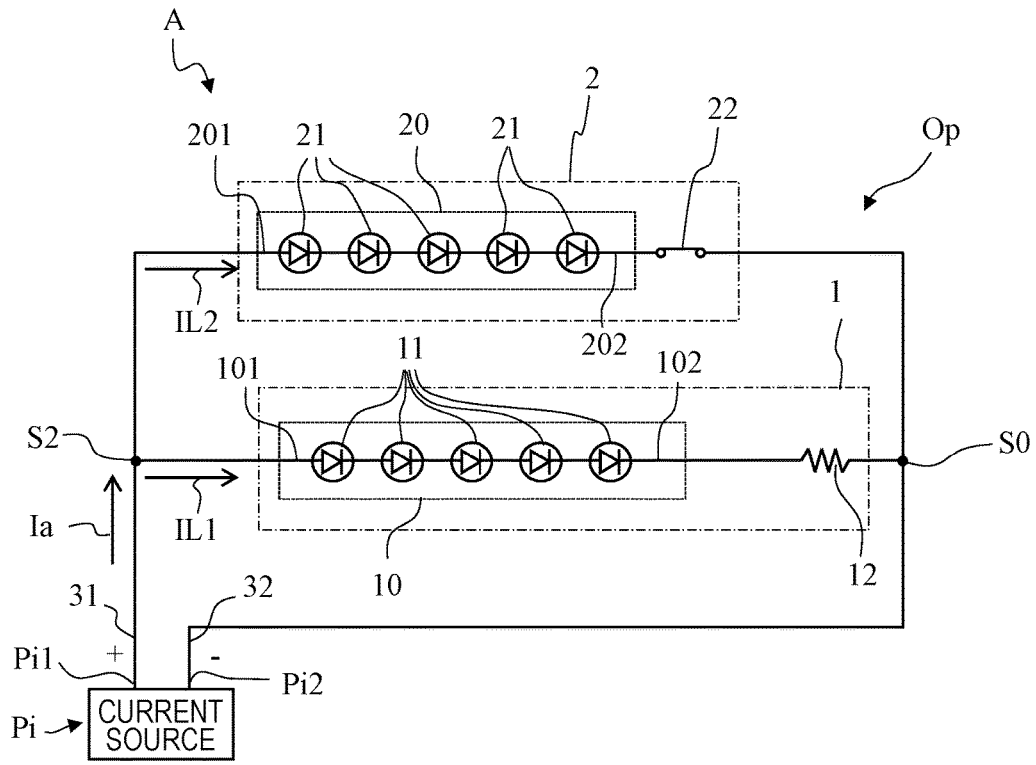
FIG. 3 is a diagram in which the thyristor in an ON state is replaced by a switch in the circuit diagram of the illumination device illustrated in FIG. 2.

The light emitting device Op uses above-described characteristics of the thyristor 22. Details of the light emitting device Op will be described. FIG. 2 is a diagram in which the thyristor in an OFF state is replaced by a switch in a circuit diagram of the illumination device illustrated in FIG. 1. FIG. 3 is a diagram in which the thyristor in the ON state is replaced by a switch in the circuit diagram of the illumination device illustrated in FIG. 2. Note that in FIG. 2 and FIG. 3, the current flow is indicated by arrows.

First, in a state where power is not supplied from the current source Pi (state in FIG. 1), the current does not flow through either the first light emitting unit 1 or the second light emitting unit 2, and light is not emitted. As illustrated in FIG. 2, the thyristor 22 is turned OFF. In this state, when power starts being supplied from the positive electrode Pi1 of the current source Pi to the first connection terminal 31, the whole supplied current flows to the first LED group 10 of the first light emitting unit 1. Note that it is assumed that in a case where the current is supplied from the current source Pi, the voltage that is the total forward voltage SVf1 or more but less than the upper limit value is applied to the second connection point S2.

Given that the current value of the current supplied from the current source Pi is a current value Ia and the current value of the current that flows through the first LED group 10 of the first light emitting unit 1 is a current value IL1, Ia=IL1 holds. Then, given that the resistance value of the resistance 12 is a resistance value RL, because direct current flows between the first LED group 10 and the resistance 12, the current that flows through the first LED group 10 flows through the resistance 12 without any change, that is, a current of the current value IL1 flows through the resistance 12. As described above, the negative electrode Pi2 of the current source Pi is grounded, and the voltage of the reference point S0, which is a point on the wiring which is connected with the second connection terminal 32 connected with the negative electrode Pi2, is "0". Then, because the current of the current value IL1 flows through the resistance 12, a voltage Vg of the first connection point S1 may be obtained by the following formula.

$$Vg=IL1\times RL$$

That is, the voltage of the first connection point S1 is decided in accordance with the current value IL1 of the current which flows through the first LED group 10 (here, similar to the current value Ia of the current supplied from the current source Pi) and the resistance value RL of the resistance 12. Further, as illustrated in FIG. 1, the cathode 222 of the thyristor 22 is at the same potential as the reference point S0, and the gate 223 is at the same potential as the first connection point S1. That is, the gate voltage of the thyristor 22 in a case where the current of the current value IL1 flows through the first LED group 10 is the voltage Vg.

As described above, the thyristor 22 is turned ON by applying the trigger voltage to the gate. Given that the voltage value at which the thyristor 22 is switched from OFF to ON is a voltage value Vgt, the thyristor 22 Keeps being turned OFF in the light emitting device Op while Vg<Vgt, and the current does not flow through the second LED group 20 of the second light emitting unit 2. In other words, in a case where the current value IL1 of the current that flows through the first LED group 10 satisfies IL1<Vgt/RL, the LEDs 11 of the first LED group 10 are lit. The beam amount of light in a case where the LED emits light changes in accordance with the current value. Thus, a current IL1 that flows through the first LED group 10 is fluctuated in the range of IL1<Vgt/RL and the beam amount of light emitted from each of the LEDs 11 is thereby adjusted, that is, dimming of the first light emitting unit 1 is possible.

In addition, when the thyristor 22 is turned OFF, the current value Ia of the current supplied from the current source Pi is the same as the current value IL1 of the current that flows through the first LED group 10 of the first light emitting unit 1. Thus, in the illumination device A, the current value Ia that is supplied at a start of an action (that is, a power supply stopped state is fluctuated in the range of Ia<Vgt/RL, and the beam amount of light emitted from the LEDs 11 of the first LED group 10 is thereby adjusted, that is, dimming is possible. Because the LED 11 is an LED that emits the light in the first emission color, the illumination device A may emit light in the first emission color while performing dimming.

When the current value Ia of the current supplied from the current source Pi becomes Ia>Vgt/RL, the voltage Vg of the first connection point S1 becomes higher than Vgt, and the thyristor 22 is turned ON. When the thyristor 22 is turned ON, the illumination device A has a circuit illustrated in FIG. 3. That is, the first light emitting unit 1 and the second light emitting unit 2 are in parallel connected with the current source Pi. Here, given that the current value of the current that flows through the second LED group 20 of the second light emitting unit 2 is a current value IL2, the relationship with the current value Ia of the current supplied from the current source Pi and the current value IL1 of the current that flows through the first LED group 10 of the first light emitting unit 1 becomes as follows.

$$Ia = IL1 + IL2$$

That is, the current (current value Ia) supplied from the current source Pi are divided at the second connection point S2 into the current (current value IL1) that flows through the first light emitting unit 1 and the current (current value IL2) that flows through the second light emitting unit 2. Accordingly, the LEDs 11 of the first LED group 10 of the first light emitting unit 1 and the LEDs 21 of the second LED group 20 of the second light emitting unit 2 emit light.

When the current value Ia of the current supplied from the current source Pi becomes Ia>Vgt/RL, because the current flows through the second light emitting unit 2, the current value IL1 of the current that flows through the first LED group 10 of the first light emitting unit 1 becomes small. Accordingly, the voltage value Vg (=RL×IL1) of the first connection point S1 decreases and becomes lower than the voltage Vgt that turns ON the thyristor 22. Once the thyristor 22 is turned ON, even if the voltage applied to the gate 223 fluctuates, the current flows between the anode and the cathode. Thus, even if the current IL1 that flows through the first LED group 10, that is, the resistance 12 decreases and the voltage value Vg, of the first connection point S1 decreases, the thyristor 22 maintains the ON state, and the current of the current value IL2 flows through the second LED group 20 of the second light emitting unit 2.

Here, a description will be made about the relationship between the current value IL1 and the current value IL2 in a case where the thyristor 22 is turned ON. As illustrated in FIG. 3, when the thyristor 22 is turned ON, the first light emitting unit 1 and the second light emitting unit 2 become parallel. Here, the current supplied from the current Source Pi flows more through the first LED group 10 or the second LED group 20, whose total forward voltage is lower. For example, in a case where the total forward voltage is in the relationship of SVf1>SVf2, the current values of the currents that flow through the LED groups are IL1<IL2.

In the light emitting device Op according to the present invention, the total forward voltage SVf1 of the first LED group 10 and the total forward voltage SVf2 of the second LED group 20 are decided such that SVf1>SVf2 and SVf1−SVf2>Th1. Here, Th1 is a threshold value and is a predetermined value. The total forward voltage SVf1 of the first LED group 10 and the total forward voltage SVf2 of the second LED group 20 are decided in such a manner, and the current value IL1 of the current that flows through the first light emitting unit 1 and the current value IL2 of the current that flows through the second light emitting unit become IL1<<IL2 when the thyristor 22 is turned ON. Note that the threshold value Th1 is decided in accordance with the used LED.

In the illumination device A that includes the light emitting device Op in the above configuration, when the thyristor 22 is turned OFF, the current supplied from the current source Pi flows through the first light emitting unit 1. Accordingly, the LEDs 11 which are included in the first light emitting unit 1 and whose emission color is the first emission color emit light. The thyristor 22 is controlled so as to be turned ON by the current supplied to the first light emitting unit 1. Thus, in the illumination device A, the current supplied to the first light emitting unit 1, that is, the current value Ia of the current supplied from the current source Pi is fluctuated at less than the current value (Vgt/RL) that turns ON the thyristor 22, and it is thereby possible to dim the light in the first emission color (daylight color).

Further, when the thyristor 22 is turned ON, most of the current supplied from the current source Pi flows through the second light emitting unit 2. Accordingly, the LEDs 21 which are included in the second light emitting unit 2 and whose emission color is the second emission color emit light. Here, although the current also flows through the first light emitting unit 1, the current value IL1 is very small, and the beam amount of light emission of the LEDs 11 is thus a slight amount. That is, when the thyristor 22 is turned ON, the second light emitting unit 2 that includes the LEDs 21 whose emission color is the second emission color mainly emits light. Although the first light emitting unit 1 that includes the LEDs 11 whose emission color is first emission light light emit light, an influence on the emission color of the light emitted from the second light emitting unit 2 is suppressed.

Once the thyristor 22 is turned ON, the thyristor 22 is not turned OFF unless the voltage becomes the voltage for retaining conduction between the anode and the cathode or less or the current is blocked. Thus, after the thyristor 22 is turned ON, the current value Ia. of the current supplied from the current source Pi is fluctuated in a range in which the voltage does not become the voltage for retaining conduction between the anode and the cathode or less, and it is thereby possible to dim the light in the second emission color (incandescent-lamp color).

Usually, as for an LED, a forward current value If is predetermined, and in a light emitting device, a circuit is designed such that a current of the forward current value If or less is caused to flow through the LED. A description will be made about a case of using the resistance 12 with the resistance value RL that makes the voltage of the first connection point S1 become Vgt in a case where the forward current values of the LED 11 and the LED 21 are the same If and where the current of the forward current value If flows through the resistance 12. In this case, in the illumination device A, when the current of the forward current value If flows through the first light emitting unit 1, the voltage of the first connection point S1 becomes Vgt, and the thyristor 22 is turned ON.

That is, because the total forward voltage SVf1 of the first LED group 10 of the first light emitting unit 1 is higher than the total forward voltage SVf2 of the second LED group 20 of the second light emitting unit 2, it becomes difficult to cause the forward current value If to pass through. Thus, in the actual light emitting device Op, the resistance value RL of the resistance 12 is preferably set such that the voltage of the first connection point S1 becomes below the voltage value Vgt that turns ON the thyristor 22 when the forward current value If flows. That is, it is preferable that RL<Vgt/If holds. However, causing a current that largely exceeds the forward current value If to flow through the LED results in failure such as malfunction. Thus, the resistance 12 preferably includes the resistance value RL that makes the voltage of the first connection point S1 become Vgt when the current exceeds the forward current value If in a safe range for an LED 10.

In addition, when the thyristor 22 is turned ON, the current value Ia of the current supplied from the current source Pi is larger than a forward current If. Thus, when the emission color of emitted light is switched from the first emission color to the second emission color, a current close to the forward current If flows through the second light emitting unit 2. For example, depending on a using method, it is desirable to initially dim the light in the second emission color from a start of an operation. In this case, the voltage value of the first connection point S1 is instantly raised to Vgt in a short period that a user may not recognize, the thyristor 22 is to ON, and dimming may thereafter be performed by adjusting the current source Pi. In the actual light emitting device Op, light in the first emission color is emitted from the first light emitting unit 1. However, because the light is emitted in a short time, the user may not recognize the light in the first emission color. Thus, the user recognizes that the light in the second emission color is emitted from the start of the operation of the illumination device A to dim the light.

In the light emitting device Op according to this embodiment, the number of LEDs 11 of the first LED group 10 of the first light emitting unit 1 is the same as the number of LEDs 21 of the second LED group 20 of the second light emitting unit 2. Thus, the LED 11 with a forward voltage Vf1 and the LED 21 with a forward voltage Vf2 are employed, with which the difference between the total forward voltage SVf1 of the first LED group 10 and the total forward voltage SVf2 of the second LED group 20 becomes the threshold value Th1 or more.

Figure 4:
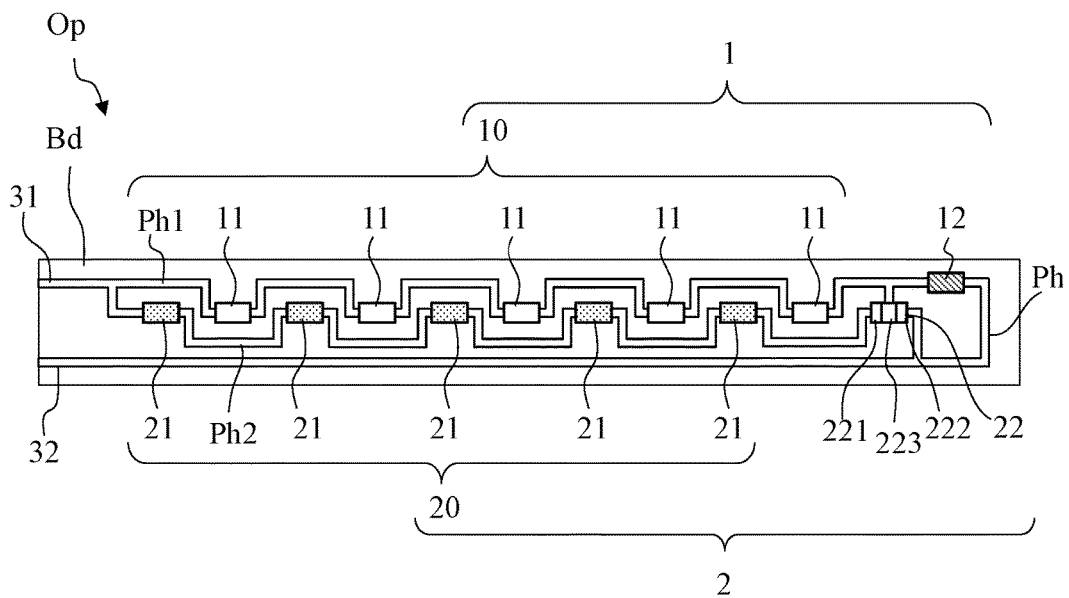
FIG. 4 is a diagram that illustrates an outline configuration of a light emitting device according to the present invention.

A specific example of the light emitting device Op that has a circuit configuration as descried above will be described with reference to the drawings. FIG. 4 is a diagram that illustrates an outline configuration of the light emitting device according to the present invention. As illustrated in FIG. 4, the light emitting device Op is provided with a substrate Ed and printed wiring Ph that is formed on an upper surface of the substrate Bd. The printed wiring Ph has a first path Ph1 for connecting the five LEDs 11 of the first LED group 10 of the first light emitting unit 1 in series and a second path Ph2 for connecting the five LEDs 21 of the second LED group 20 of the second light emitting unit 2 in series.

End portions of the first path Ph1 and the second path Ph2 on positive electrode sides are connected together at one point. In addition, the printed wiring Ph includes the first connection terminal 31 that extends from a connecting point on the positive electrode side to an end portion of the substrate Bd. Further, end portions of the first path Ph1 and the second path Ph2 on negative electrode sides are connected together at one point. In addition, the printed wiring Ph includes the first connection terminal 31 that extends from a connecting point on the negative electrode side to the end portion of the substrate Bd. Note that as illustrated in FIG. 1 and so forth, the positive electrode Pi1 of the current source Pi and the negative electrode Pi2 of the current source Pi are respectively connected with the first connection terminal 31 and the second connection terminal 32.

As illustrated in FIG. 4, the first path Ph1 and the second path Ph2 are in shapes in which protrusion portions are inserted in respective recess portions. In addition, the LEDs 11 and the LEDs 21 are mounted on the respective protrusion portions. Mounting in such a manner makes the LEDs 11 and the LEDs 21 be aligned at regular intervals in a linear manner. Alignment in such a manner enables beams of light emitted from the illumination device A to be made uniform when the LEDs 11 of the first LED group 10 emit light or when the LEDs 21 of the second LED group 20 emit light.

In the illumination device A of the present invention, the thyristor 22 may be turned ON or OFF by fluctuating the current value Ia of the current supplied from the current source Pi. In addition, the current value Ia of the current supplied from the current source Pi is fluctuated, and it is thereby possible to switch the emission color of light emitted from the illumination device A into the first emission color (here, neutral white) or the second emission color (here, incandescent-lamp color) and to perform dimming in each of the emission colors.

In the illumination device A according to the present invention, as described above, the thyristor 22 may be turned into the OFF state or the ON state by adjusting the current value of the current supplied from the current source Pi. Thus, a control unit is not requested which generates and outputs a control signal for controlling the thyristor. Accordingly, the number of components may be decreased, and the costs requested for manufacture may be reduced. Further, because the number of components is lessened, size reduction and weight saving are easy.

The illumination device A according to the present invention has a configuration in which the thyristor 22 or a switching element 23 is connected with the negative electrode terminal 202 of the second LED group 20. However, the configuration is not limited to this, but the thyristor 22 or the switching element 23 may be connected with the positive electrode terminal 201. In this case, the anode 221 of the thyristor 22 is connected with the second connection point S2, and the cathode 222 is connected with the positive electrode terminal 201 of the second LED group 20. Further, the gate 223 of the thyristor 22 is connected with the first connection point S1. In such a configuration, because the current flows from the anode to the cathode when the thyristor 22 is turned ON, the current flows through the second LED group 20. Further, the thyristor 22 may be attached among the plural LEDs 21 of the second LED group 20.

Figure 5:
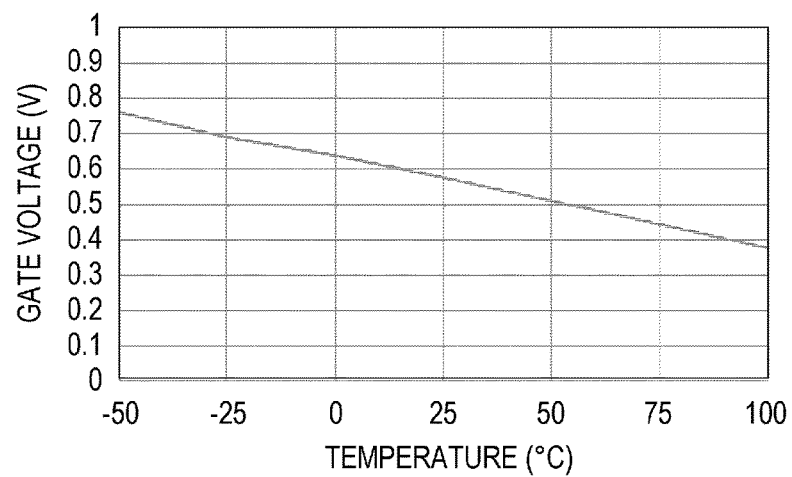
FIG. 5 is a diagram that illustrates a temperature characteristic of the thyristor.

The thyristor 22 used for the illumination device A according to the present invention is a semiconductor element, and the voltage at which the thyristor 22 is turned ON changes in accordance with the change in temperature. FIG. 5 is a diagram that illustrates a temperature characteristic of the thyristor. In a graph illustrated in FIG. 5, the vertical axis represents the voltage value (V) at which the thyristor 22 is turned ON, and the horizontal axis represents the temperature of the thyristor 22.

As described above, the thyristor 22 is turned ON in accordance with the magnitude of the current IL1 that flows through the first light emitting unit 1. That is, when the relationship of IL1 Vgt/RL holds among the current that flows through the first light emitting unit 1, a gate voltage Vgt, and a resistance R, the thyristor 22 is turned ON. Meanwhile, as illustrated in FIG. 5, the voltage value Vgt of the gate voltage for turning ON the thyristor 22 becomes low due to a temperature rise of the thyristor. For example, in a case where the resistance value RL of the resistance 12 is a fixed value, when the voltage value Vgt becomes small, the thyristor 22 is switched ON even if the current that flows through the first light emitting unit 1 is small. In the illumination device A, as the temperature of the thyristor 22 rises more, the thyristor 22 is turned ON at the smaller current value IL1, and the range of dimming in the first emission color becomes narrower.

In order to handle such a change, due to the temperature of the thyristor 22, in the gate voltage Vgt at which the thyristor 22 is turned ON, it is preferable to use a resistance, which has a characteristic in which the resistance value becomes small in response to the temperature rise (negative resistance), as the resistance 12 of the first light emitting unit 1. Because the current does not flow when the thyristor 22 is turned OFF, a main cause of the temperature rise of the thyristor 22 is heat generation by the LEDs 11 of the first LED group 10. The heat of the LEDs 11 is transmitted to the resistance 12, and the temperature of the resistance 12 also rises. In a case where the resistance 12 has the negative resistance, a gate voltage value Vgt at which the thyristor 22 is turned ON becomes low, and the resistance value RL of the resistance 12 also becomes low. Thus, the change in the current value IL1 that flows through the first light emitting unit 1 in a case where the thyristor 22 is turned ON may be made small. Accordingly, in the illumination device A, even if the temperature of the thyristor 22, that is, the temperature on the inside of the device changes, the range of dimming of the light in the first emission color may be inhibited from changing.

Note that as a resistance that has the negative resistance, ceramics in which oxides of metal such as manganese (Mn), nickel (Ni), and cobalt (Co) are fired, semiconductors that use silicon (Si), germanium (Ge), gallium nitride (GaN), gallium arsenide (GaAs), and indium gallium nitride (InGaN), and so forth may be raised. A material of the resistance 12 is selected in accordance with the change, due to the temperature, in the gate voltage Vgt at which the thyristor 22 is turned ON, and the range of dimming of the light in the first emission color may be inhibited from changing due to the temperature.

Modification Example

Figure 6:
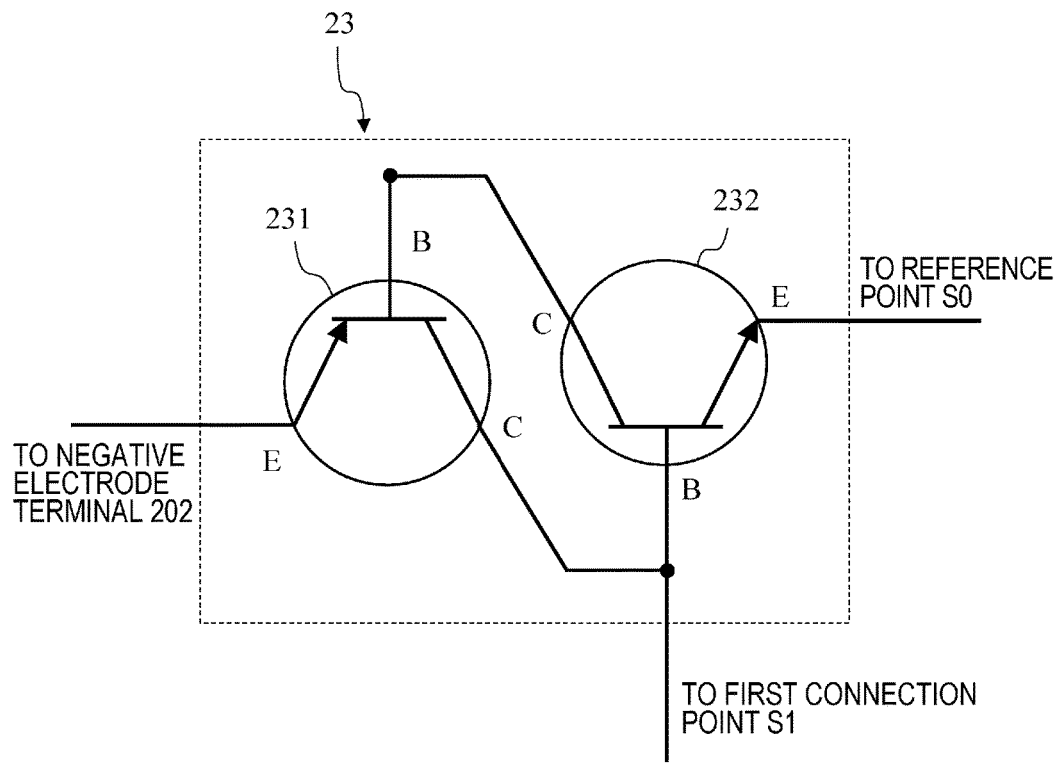
FIG. 6 is a diagram that illustrates a switching element which is used instead of the thyristor.

In this embodiment, a configuration is provided which includes the thyristor 22 in series with the second LED group 20 of the second light emitting unit 2. Embodiments are not limited to the thyristor. For example, a switching element in a configuration illustrated in FIG. 6 may be used instead of the thyristor 22. FIG. 6 is a diagram that illustrates the switching element which is used instead of the thyristor. Note that FIG. 6 illustrates a configuration that uses two bipolar transistors. Here, the configuration will be described as the switching element 23.

The switching element 23 illustrated in FIG. 6 is an equivalent circuit to the thyristor, in which a PNP bipolar transistor 231 and an NPN bipolar transistor 232 are combined. The switching element 23 connects a base terminal of the PNP bipolar transistor 231 with a collector terminal of an NPN bipolar transistor. Further, a collector terminal of the PNP bipolar transistor 231 is connected with a base terminal of the NPN bipolar transistor. In addition, an emitter terminal of the PNP bipolar transistor 231 of the switching element 23 is connected with the negative electrode terminal 202 of the second LED group 20 of the second light emitting unit 2. Further, an emitter terminal of the NPN bipolar transistor 232 is connected with the reference point S0. In addition, a base terminal of the NPN bipolar transistor 232 is connected with the first connection point S1.

In the switching element 23 in such a configuration, a voltage is applied to the base terminal of the NPN bipolar transistor 232, a current thereby flows from an emitter to a base of the PNP bipolar transistor 231, and the current flows from a collector to an emitter of the NPN bipolar transistor 232. Further, a base of the NPN bipolar transistor 232 is at the same voltage as a collector voltage of the PNP bipolar transistor 231. Thus, because a state where the voltage for conduction between the collector and the emitter of the NPN bipolar transistor is retained even if the voltage at the first connection point S1, the switching element 23 retains the ON state.

It is possible to perform a similar action to the thyristor 22 by using such a switching element 23.

Second Embodiment

Figure 7:
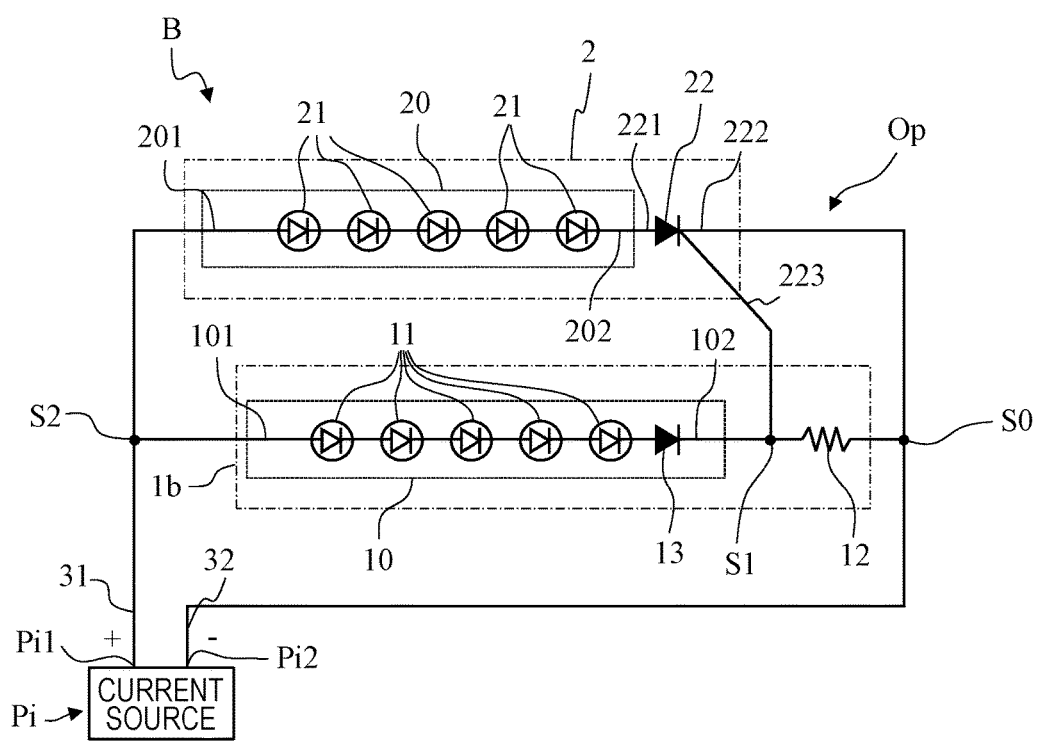
FIG. 7 is a diagram that illustrates another example of the illumination device according to the present invention.

Another example of the illumination device according to the present invention will be described with reference to the drawings. FIG. 7 is a diagram that illustrates another example of the illumination device according to the present invention. An illumination device B illustrated in FIG. 7 has the same configuration as the illumination device A except that a first light emitting unit 1b is different. Thus, the same portions of the illumination device B as the illumination device A are provided with the same reference characters, and detailed descriptions of the same portions will not be made.

The relationship of Vf1>Vf2 is present between the forward voltage Vf1 of the LED 11 and the forward voltage Vf2 of the LED 21, which are used in the illumination device A. Thus, the total forward voltage SVf1 of the first LED group 10 in which the five LEDs 11 are connected in series becomes large compared to the total forward voltage SVf2 of the second LED group 20 in which the five LEDs 21 are connected in series in the same manner.

Meanwhile, there may be a case where the forward voltage Vf1 of the LED 11 is the same as the forward voltage Vf2 of the LED 21. In this case, the total forward voltage SVf1 of the first LED group 10 becomes the same value as the total forward voltage SVf2 of the second LED group 20. In the illumination device B, in order to accurately switch the first emission color and the second emission color, the total forward voltage SVf1 and the total forward voltage SVf2 are set such that SVf1 SVf2>Th1 holds. In a case of Vf1=Vf2, the number of LEDs 11 is made more than the number of LEDs 21, and it thereby becomes possible to obtain a configuration that satisfies the above-described condition.

In the illumination device, there may be a case where the beam amount of the light in the first emission color is set to the same beam amount as the beam amount of the light in the second emission color. In a case where the beam amounts of light emitted by the LED 11 and the LED 21 are the same, it is difficult to provide different numbers of LEDs 11 and LEDs 21. Thus, in the illumination device B, the first light emitting unit in includes a diode 13 that is disposed in series with the first LED group 10. The diode 13 is arranged between the negative electrode terminal 102 of the first LED group 10 and the first connection point S1. In such a manner, the forward voltage of the diode 13 that is connected in series with the first LED group 10 of the first light emitting unit 1 is adjusted, and a total forward voltage SVf1b of the first LED group 10 that includes the diode 13 may thereby be set such that SVf1b−SVf2>Th1 holds.

Accordingly, in the illumination device A, when the thyristor 22 is turned OFF, the current supplied from the current source Pi flows through the first light emitting unit 1b, and the light in the first emission color is emitted from the LEDs 11 of the first LED group 10. Further, when the thyristor 22 is turned ON, most of the current supplied from the current source Pi flows through the second light emitting unit 2, and the light in the second emission color is emitted from the LEDs 21 of the second LED group 20.

As discussed above, in the illumination device 13, the diode 13 is connected in series with the first LED group 10, and it is possible to adjust the total forward voltage SVf1b by a simple configuration. Note that in this embodiment, a description is made on an assumption that all the forward voltages of the used LEDs are the same. However, embodiments are not limited to this. For example, in order to adjust the difference between the total forward voltage of the first LED group 10 of the first light emitting unit 1b and the total forward voltage of the second LED group 20 of the second light emitting unit 2, a diode may be connected in series. Note that in this embodiment, it is assumed that the diode is connected in series with an LED group of a first light emitting unit. However, embodiments are not limited to this. For example, in a case where the difference between the total forward voltages is too large, the diode may be connected in series with the LED group of the second light emitting unit 2. Further, diodes with different forward voltages may respectively be connected in series with the LED groups of both of the light emitting units, and the difference between the total forward voltages may thereby be adjusted. Further, the number of connected diodes is not limited to one, but plural diodes may be connected.

Third Embodiment

Figure 8:
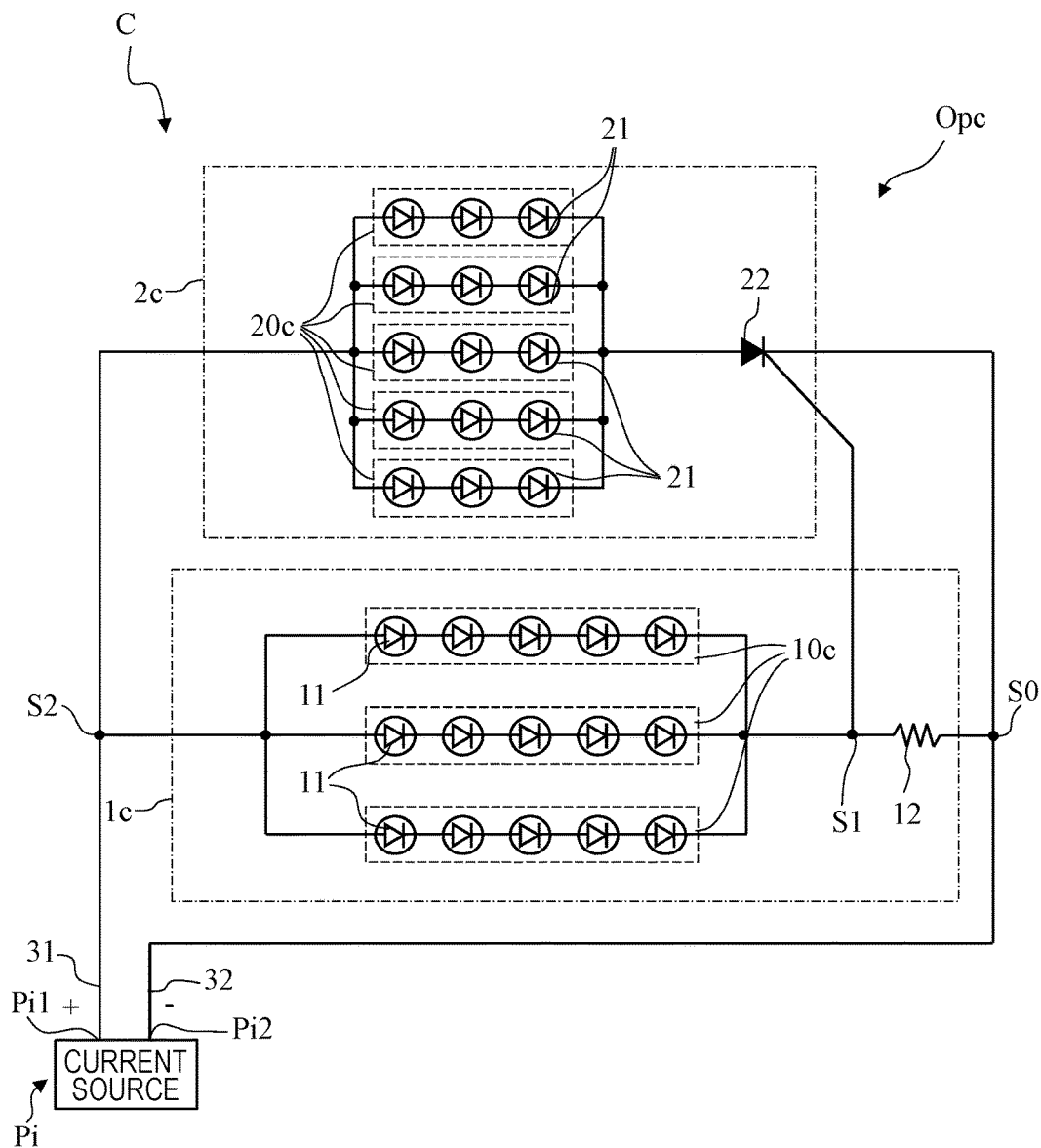
FIG. 8 is a diagram that illustrates still another example of the illumination device according to the present invention.

Still another example of the illumination device according to the present invention will be described with reference to the drawings. FIG. 8 is a diagram that illustrates still another example of the illumination device according to the present invention. As for an illumination device C illustrated in FIG. 8, in a first light emitting unit 1c, three first LED groups 10c in which plural (here, five) LEDs 11 are connected in series are connected in parallel. Further, in a second light emitting unit 2c, five second. LED groups 20c in which plural (here, three) LEDs 21 are connected in series are connected in parallel. The other portions than those are the same as the illumination device A of the first embodiment. Thus, in a configuration of the illumination device C, substantially same portions as the illumination device A are provided with the same reference characters, and detailed descriptions of the same portions will not be made.

A current flows through an LED by applying a voltage that is a predetermined voltage or more in the forward direction in other words, for the LED, the voltage that is the predetermined voltage or more has to be applied in the forward direction. Thus, there is an upper limit for the number of LEDs that are connectable in series in accordance with the applied voltage and the characteristics of the LED. In the illumination device C, depending on the demanded beam amount, more LEDs than the number of LEDs connectable in series may be requested. Thus, in the illumination device C, the plural LED groups, in which a less number of LEDs than the upper limit of the number of LEDs connectable in series are connected in series, are connected in parallel, and the demanded numbers of LEDs are thereby mounted.

As illustrated in FIG. 8, in the illumination device C, the first light emitting unit 1c includes the three first LED groups 10c in which the five LEDs 11 are connected in series. In addition, the three first LED groups 10c are connected in parallel. That is, the three first LED groups 10c are connected in parallel with respect to the current source Pi. In the first light emitting unit 1c, the first LED groups 10c are connected in parallel, and a total forward voltage SVf1c of the first light emitting unit 1c is the same as a total forward voltage of the first LED groups 10c, that is, SVf1c=5×Vf1 holds. Further, the resistance 12 is connected in series with the first LED groups 10c that are connected in parallel.

As illustrated in FIG. 8, in the illumination device C, the second light emitting unit 2c includes the five second LED groups 20c in which the three LEDs 21 are connected in series. In addition, the five second LED groups 20c are connected in parallel. That is, the five second LED groups 20c are connected in parallel with respect to the current source Pi. In the second light emitting unit 2c, the second LED groups 20c are connected in parallel, and a total forward voltage SVf2c of the second light emitting unit 2c is the same as a total forward voltage of the second LED groups 20c, that is, SVf2c−3×Vf2 holds. Further, the thyristor 22 is connected in series with the second LED groups 20c that are connected in parallel.

In the illumination device C, the first light emitting unit 1c includes 15 LEDs 11, and the second light emitting unit 2c includes 15 LEDs 21. Thus, it is possible to make the beam amounts of light emitted from the illumination device C the same or substantially same between the light in the first emission color and the light in the second emission color.

In addition, in a case where the forward voltages of the LEDs 11 and 21 are the same, that is, Vf1=Vf2 holds, the number of LEDs connected in series in the first light emitting unit 1c is large compared to the second light emitting unit 2c, and thus SVf1c>SVf2c holds. Note that in the illumination device C according to the present invention, because the number of LEDs is 15 for each of the first light emitting unit 1c and the second light emitting unit 2c, the selection ranges of the number of LEDs aligned in series and the number of LEDs in parallel are narrow. However, in a case where much more LEDs are used, more combinations of LEDs in series and in parallel are provided. Among the combinations, the first light emitting unit 1c and the second light emitting unit 2c are formed in the combination that makes SVf1c−SVf2c>Th1 hold. Accordingly, the illumination device C is capable of switching the emission color of emitted light to the first emission color or the second emission color by turning ON or OFF the thyristor 22.

In such a manner, in the illumination device C, the number of LEDs connected in series and the number of parallel connections of the LEDs connected in series may be adjusted, and it is possible to switch the emission colors and to perform dimming in each of the emission colors by a simple configuration. The other characteristics than those are the same as the first embodiment and the second embodiment.

Figure 9:
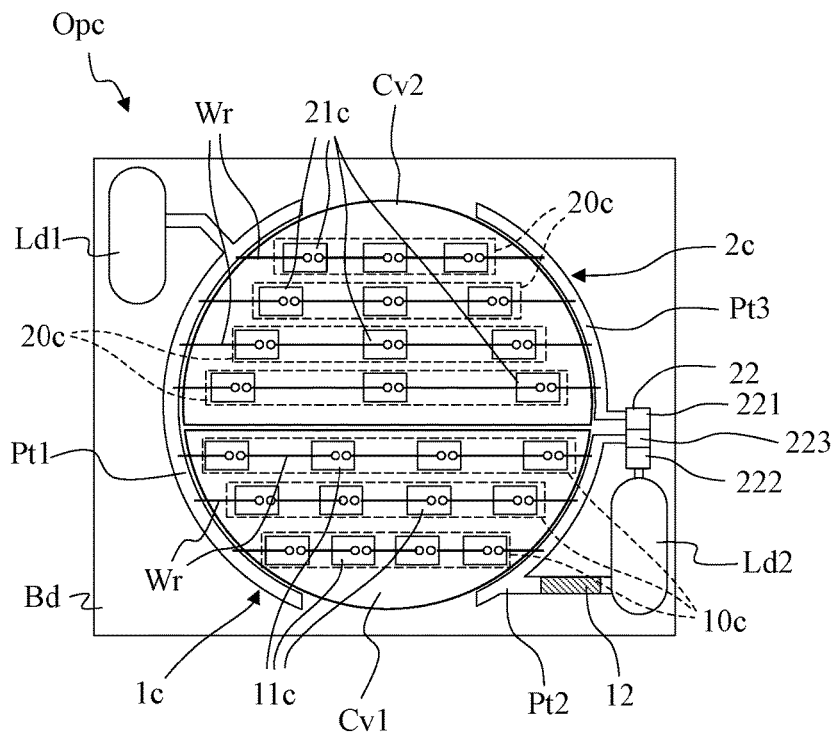
FIG. 9 is a diagram that illustrates an outline configuration of a light emitting device according to the present invention.

In a configuration in which plural LEDs are connected in series and the LEDs connected in series are connected in parallel, work for connection is likely to become troublesome. Thus, one chip may be formed as a light emitting device Opc. FIG. 9 is a diagram that illustrates an outline configuration of a light emitting device according to the present invention.

As illustrated in FIG. 9, the light emitting device Opc has the substrate Bd, a first wiring pattern Pt1, a second wiring pattern Pt2, a third wiring pattern Pt3, the resistance 12, the thyristor 22, a first land unit Ld1, a second land unit Ld2, a first sealing unit Cv1, and a second sealing unit Cv2. The resistance 12 and the thyristor 22 are the same as those described above, and details will thus not be described.

In the light emitting device Opc of this embodiment, the first wiring pattern Pt1, the second wiring pattern Pt2, and the third wiring pattern Pt3 are arcs which are formed on a circumference with the same center and radius and whose central angles are different. In addition, the second wiring pattern Pt2 and the third wiring pattern. Pt3 are formed while neighboring each other, and the first wiring pattern Pt1 is formed to be opposed to the second wiring pattern Pt2 and the third wring pattern Pt3. In the light emitting device Opc illustrated in FIG. 9, the first light emitting unit 1c that includes plural first LED groups 10c and the second light emitting unit 2c that includes plural second LED groups 20c are arranged in a circular portion that is surrounded by the first wiring pattern Pt1, the second wiring pattern Pt2, and the third wiring pattern Pt3. Note that in a state illustrated in FIG. 9, the first light emitting unit 1c is arranged in a lower half of the light emitting device Opc, and the second light emitting unit 2c is arranged in an upper half.

The first light emitting unit 1c includes plural first LED groups 10c, and the plural first LED groups 10c are connected in parallel. The first LED group 10c uses a LED chip 11c formed as a chip. In the first LED group 10c, plural LED chips 11c are connected in series by using wires Wr. Note that in consideration of viewing easiness of the drawing, in the light emitting device Opc illustrated in FIG. 9, three first LED groups 10c in which four LED chips 11c are connected in series are connected in parallel in the first light emitting unit 1c. Further, similarly to the first light emitting unit 1c, the second light emitting unit 2c includes plural second LED groups 20c, and the plural second LED groups 20c are connected in parallel. Similarly to the first LED group 10c, the second LED group 20c also uses a LED chip 21c formed as a chip. In the second LED group 20c, plural LED chips 21c are connected in series by using wires Wr. Note that in consideration of viewing easiness of the drawing, in the light emitting device Opc illustrated in FIG. 9, four second LED groups 20c in which three LED chips 21c are connected in series are connected in parallel in the second light emitting unit 2c. The first light emitting unit 1c includes 12 LED chips 11c, and the second light emitting unit 2c includes 12 LED chips 21c. That is, in the light emitting device Opc illustrated in FIG. 9, the numbers of LED chips 11c and 21c that are respectively included in the first light emitting unit 1c and the second light emitting unit 2c are the same numbers. However, the numbers are not limited to the same numbers but may be different numbers.

The first wiring pattern Pt1 is printed wiring that is formed on the substrate Bd. Positive electrodes of the first LED groups 10c and positive electrodes of the second LED groups 20c are connected with the first wiring pattern Pt1. That is, the first wiring pattern Pt1 is a common wiring pattern to both of the first light emitting unit 1c and the second light emitting unit 2c. The first wiring pattern Pt1 is connected with the first LED groups 10c and the second LED groups 20c by the wires Wr.

The first wiring pattern Pt1 is connected with the first land unit Ld1 via a wiring pattern. A first land Ld1 is a terminal with which the positive electrode Pi1 of the current source Pi is connected and is the first connection terminal 31.

Negative electrodes of the first LED groups 10c are connected with the second wiring pattern Pt2. The second wiring pattern Pt2 is connected with a second land Ld2 via a resistance. The second land Ld2 is a terminal with which the negative electrode Pi2 of the current source Pi is connected and is the second connection terminal 32. That is, the three first LED groups 10c are connected with the first wiring pattern Pt1 on their positive electrode sides, are connected with the second wiring pattern Pt2 on their negative electrode sides, and are thereby connected in parallel.

Negative electrodes of the second LED groups 20c are connected with the third wiring pattern Pt3. The third wiring pattern Pt3 is connected with the second land unit Ld2 via the thyristor 22. The anode 221 of the thyristor 22 is connected with the third wiring pattern Pt3, the cathode 222 is connected with the second land Ld2, and the gate 223 is connected with the second wiring pattern Pt2. That is, the second LED groups 20c are connected with the first wiring pattern Pt1 on their positive electrode sides, are connected with the third wiring pattern Pt3 on their negative electrode sides, and are thereby connected in parallel.

The light emitting device Opc includes the first sealing unit Cv1 that seals a portion between the first wiring pattern Pt1 and the second wiring pattern Pt2 of the substrate Bd by a resin and the second sealing unit Cv2 that seals a portion between the first wiring pattern Pt1 and the third wiring pattern Pt3 by a resin. The first sealing unit Cv1 seals the first light emitting unit 1c that includes the three first LED groups 10c, and the second sealing unit Cv2 seals the second light emitting unit 2c that includes the four second LED groups 20c.

The first sealing unit Cv1 and the second sealing unit Cv2 have a sealing resin layer that uses a transparent resin such as a silicone resin or an epoxy resin. The first sealing unit Cv1 and the second sealing unit Cv2 are provided for purposes such as protection of the LED chips 11c, the LED chips 21c, and the wires Wr, an improvement in light-output efficiency, changes in light distribution characteristics, and further retainment of a phosphor that converts the emission colors. Note that in a configuration in which the characteristics of the sealing units are the same, for example, the emission colors of the LED chips are used without any change, that is, in a case where conversion of the emission colors are not requested or the substances that convert light are the same, the first sealing unit Cv1 and the second sealing unit Cv2 may be integrated into one sealing unit and may thereby seal the whole.

As discussed above, the light emitting device Opc may be formed as a chip on board (COB) in which plural LED chips 11c and plural LED chips 21c are mounted on a surface of the substrate Bd. In such a manner, size reduction is possible by integrating plural LED chips into one chip. Further, only two pieces of wiring for current supply are used, and costs may thus be lowered. Moreover, because the LED chips are dealt with as one light source by devising the sealing unit, it is possible to inhibit production of plural shadows of an object that is irradiated with light or blurriness and to cause the user not to experience an uncomfortable feeling.

Note that in this embodiment, the first wiring pattern Pt1, the second wiring pattern Pt2, and the third wiring pattern Pt3 are arc shapes. However, embodiments are not limited to this. Note that in this embodiment, the different sealing units seal the three first LED groups 10c and the four second LED groups 20c. However, in a configuration in which the emission colors of the LED chips are used without any change, that is, in a case where conversion of the emission colors is not requested or the substances that convert the emission colors are the same, one sealing unit may seal the whole. In this case, a connected body in which the plural LED chips 11c are connected in series and a connected body in which plural LED chips 21c are connected in series may be disposed alternately in parallel directions.

In this embodiment, the resistance 12 and the thyristor 22 are arranged on the substrate Bd. However, in addition to direct mounting, a land for connection is prepared on the substrate Bd, and the resistance 12 separately provided from the substrate Bd may be connected with the thyristor 22 through the land.

Modification Example 1

Figure 10:
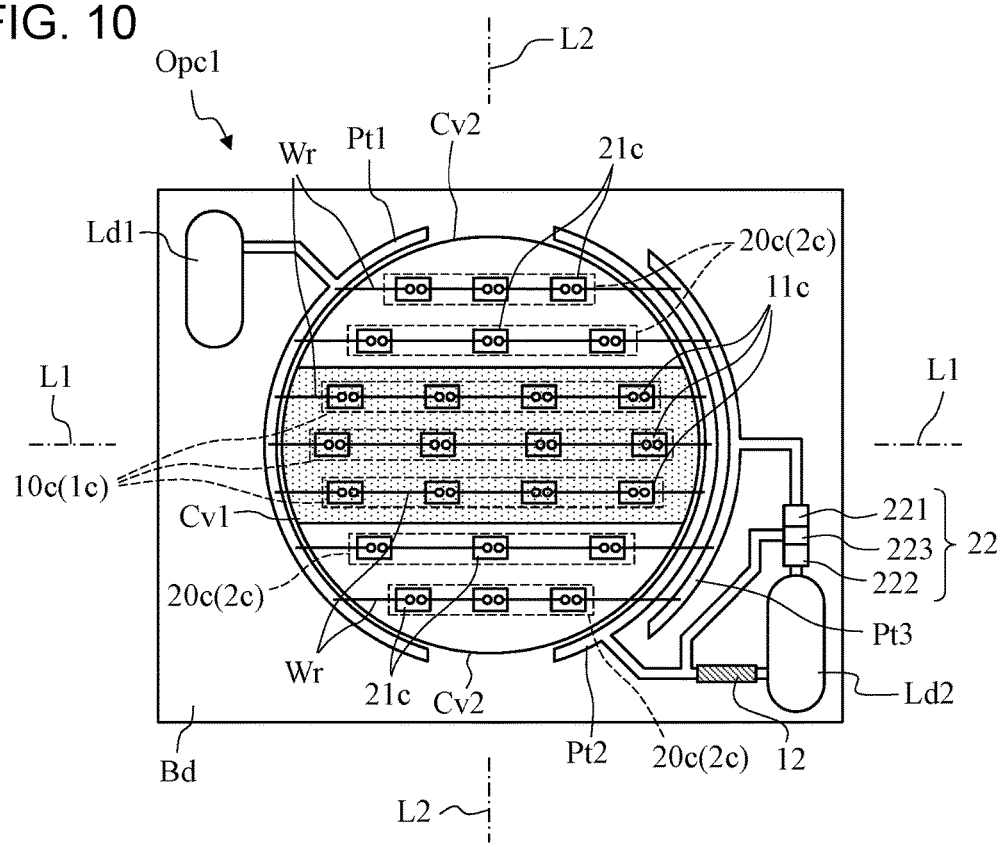
FIG. 10 is a diagram that illustrates an outline configuration of a light emitting device according to the present invention.

Still another example of the light emitting device according to this embodiment will be described with reference to the drawings. FIG. 10 is a diagram that illustrates still another example of the Light emitting device which configures the illumination device of the third embodiment. Members that configure a light emitting device Opc1 illustrated in FIG. 10 are the same as the light emitting device Opc illustrated in FIG. 9. Thus, the members that configure the light emitting device Opc1 are provided with the same reference characters as the light emitting device Opc.

In the light emitting device Opc1 illustrated in FIG. 10, the first wiring pattern Pt1 and the second wiring pattern Pt2 are arc shapes which are formed on a circumference with the same center and radius. Note that in a state illustrated in FIG. 10, the first wring pattern Pt1 is arranged on the left, and the second wiring pattern Pt2 is arranged on the right. In addition, the third wiring pattern Pt3 is an arc shape which is formed on a circumference with the same center as the first wiring pattern Pt1 and the second wiring pattern Pt2 and with a larger radius than those. The third wiring pattern Pt3 is arranged on the outside of the second wiring pattern Pt2. That is, the first wiring pattern. Pt1 and the second wiring pattern Pt2 are opposed to each other. In addition, the third wiring pattern Pt3 is arranged on the outside of the second wiring pattern Pt2.

As illustrated in FIG. 10, the light emitting device Opc1 has the first light emitting unit 1c that includes plural (here, three) first LED groups 10c and the second light emitting unit 2c that includes plural (here, four) second LED groups 20c. The first light emitting unit 1c that includes the three first LED groups 10c is arranged in a central portion in an up-down direction between the first wiring pattern Pt1 and the second wiring pattern Pt2. That is, the three first LED groups 10c are collectively arranged in the central portion in a crossing (orthogonal) direction with respect to an alignment direction of the first wiring pattern Ph1 and the second wiring pattern Pt2.

Further, the two second LED groups 20c as a set are collectively arranged in each of higher and lower portions than a portion, in which the first light emitting unit 1c is arranged, between the first wiring pattern Pt1 and the second wiring pattern Pt2. In the light emitting device Opc1, as for the second light emitting unit 2c, the two second LED groups 20c as a set are arranged in each of the higher and lower portions, dividedly. That is, in the light emitting device Opc1, the first light emitting unit 1c that includes the three first LED groups 10c is arranged between the second light emitting units 2c that are dividedly arranged.

In addition, in the light emitting device Opc1, the first wiring pattern Pt1 is connected with the positive electrodes of the first LED groups 10c and the second LED groups 20c. The first wiring pattern Pt1 is connected with the first LED groups 10c and the second LED groups 20c by the wires Wr. The first wiring pattern Pt1 is a common wiring pattern that are connected with both of the first LED groups 10c and the second LED groups 20c.

The second wiring pattern Pt2 is connected with the negative electrodes of the first LED groups 10c. The second wiring pattern Pt2 is connected with the first LED groups 10c by the wires Wr. The third wiring pattern Pt3 is connected with the negative electrodes of the second LED groups 20c. The third wiring pattern Pt3 is connected with the second LED groups 20c by the wires Wr.

The light emitting device Opc1 has the first sealing unit Cv1 and plural (here, two) second sealing units Cv2. The first sealing unit Cv1 seals the three first LED groups 10c. Further, the two second sealing units Cv2 seal the respective sets of the two second LED groups 20c that are arranged across the three first LED groups 10c. Note that to facilitate viewing of the drawing, the first sealing unit Cv1 is hatched.

Note that in this embodiment, the two second sealing units Cv2 are divided but may be coupled together at end portions. Further, in a configuration in which the characteristics of the sealing units are the same, for example, the emission colors of the LED chips are used without any change, that is, in a case where conversion of the emission colors are not requested or the substances that convert light are the same, the first sealing unit Cv1 and the second sealing units Cv2 may be integrated into one sealing unit and may thereby seal a whole portion in which the LED chips are arranged.

As illustrated in FIG. 10, in the light emitting device Opc1, in a region in which the LED chips are arranged, that is, a portion between the first wiring pattern Pt1 and the second wiring pattern Pt2, the LED chips 11c are evenly or substantially evenly arranged in the central portion. That is, plural LED chips 11c are arranged in the central portion between the first wiring pattern Pt1 and the second wiring pattern Pt2 in a well-balanced manner in up-down and left-right directions.

Further, in the light emitting device Opc1, plural LED chips 21c are evenly or substantially evenly arranged across the first light emitting unit 1c. That is, the plural LED chips 21c are arranged in the portion between the first wiring pattern Pt1 and the second wiring pattern Pt2 in a well-balanced manner in up-down and left-right directions.

That is, viewing the light emitting device Opc1 illustrated in FIG. 10, the LED chips 11c and the LED chips 21c are arranged line-symmetrically or substantially line-symmetrically to a first line L1 that extends in the alignment direction of the first wiring pattern Pt1 and the second wiring pattern Pt2 and to a second line L2 that is orthogonal to the first line L1. That is, the LED chips 11c and the LED chips 21c are arranged line-symmetrically or substantially line-symmetrically to each of two orthogonal lines (L1 and L2).

The plural LED chips 11c and the plural LED chips 21c are arranged in a state with low unevenness. Accordingly, unevenness of the beams in a case where the LED chips 11c emit light may be lessened. Accordingly, when the LED chips 21c emit light, unevenness of the beams may be lessened with respect to light that is irradiated with light.

Based on the above description, the light emitting device Opc1 of this modification example is used, and it is thereby possible to irradiate an irradiation target with the light in the first emission color and the light in the second emission color with less unevenness.

Modification Example 2

Figure 11:
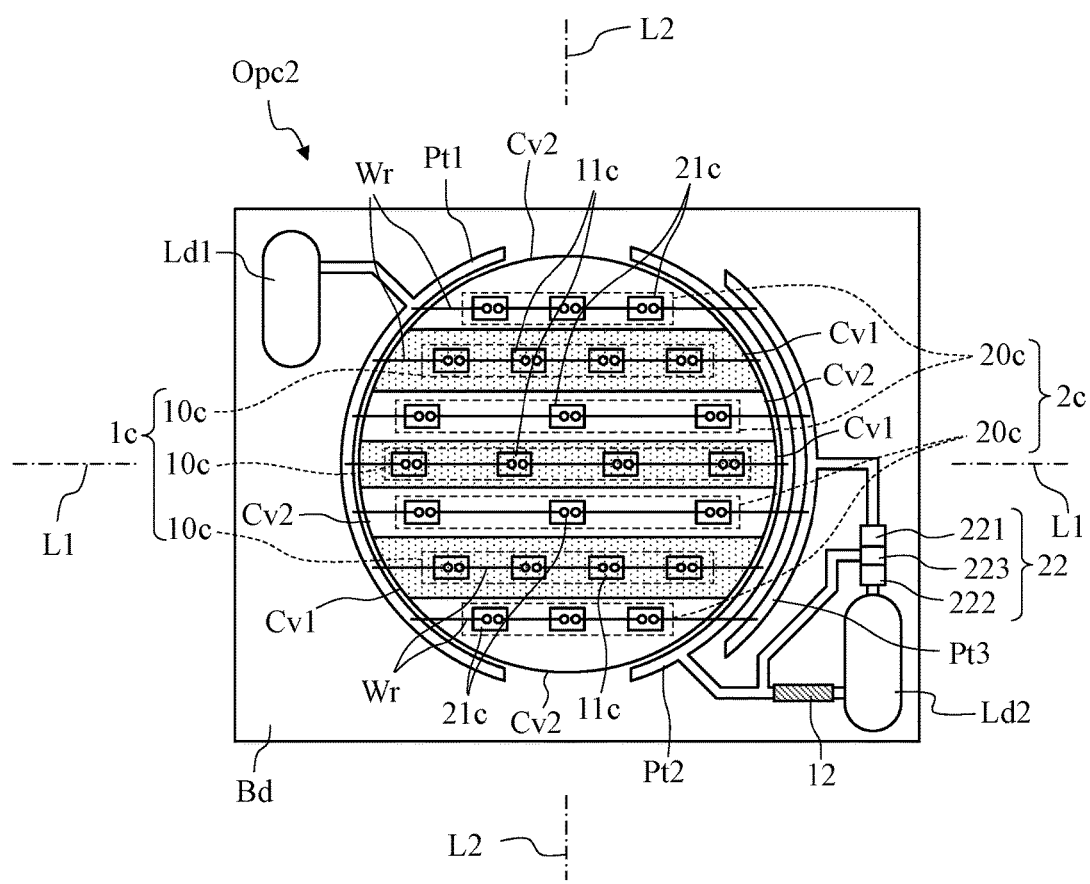
FIG. 11 is a diagram that illustrates an outline configuration of a light emitting device according to the present invention.

Another example of the light emitting device according to this embodiment will be described with reference to the drawings. FIG. 11 is a diagram that illustrates another example of the light emitting device which configures the illumination device of the third embodiment. Members that configure a light emitting device Opc2 illustrated in FIG. 11 are the same as the light emitting device Opc illustrated in FIG. 9. Thus, the members that configure the light emitting device Opc2 are provided with the same reference characters as the light emitting device Opc. Note that to facilitate viewing of the drawing, the first sealing units Cv1 are hatched.

As illustrated in FIG. 11, in the light emitting device Opc2, the first light emitting unit 1c that includes three first LED groups 10c and the second light emitting unit 2c that includes four second LED groups 20c are arranged in a portion between the first wiring pattern Pt1 and the second wiring pattern Pt2. In the light emitting device Opc2, the first LED groups 10c and the second LED groups 20c are, arranged alternately. That is, in the light emitting device Opc2, as for the first light emitting unit 1c, the first LED groups 10c are arranged one by one dividedly. In addition, the second LED groups 20c of the second light emitting unit 2c are arranged one by one among the first light emitting units 1c that are dividedly arranged. In other words, in the light emitting device Opc2, as for the second light emitting unit 2c, the second LED groups 20c are arranged one by one dividedly. In addition, the first LED groups 10c of the first light emitting unit 1c are arranged one by one among the second right emitting units 2c that are dividedly arranged.

The light emitting device Opc2 has plural (here, three) first sealing units Cv1 and plural (here, four) second sealing units Cv2. The three first sealing units Cv1 respectively seal the first LED groups 10c. Further, the four second sealing units Cv2 respectively seal the second LED groups 20c. That is, the three first sealing units Cv1 and the four second sealing units Cv2 are arranged alternately. Note that in this embodiment, the first sealing units Cv1 are divided so as to be capable of sealing the respective first LED groups 10c. However, embodiments are not limited to this. For example, the first sealing units Cv1 may be coupled together on the first wiring pattern Pt1 side. Similarly, the second sealing units Cv2 are divided but may be coupled together on the opposite side to the first sealing units Cv1. Further, in a configuration in which the characteristics of the sealing units are the same, for example, the emission colors of the LED chips are used without any change, that is, in a case where conversion of the emission colors are not requested or the substances that convert light are the same, the first sealing units Cv1 and the second sealing units Cv2 may be integrated into one sealing unit and may thereby seal a whole portion in which the LED chips are arranged.

In the light emitting device Opc2, the first LED groups 10c and the second LED groups 20c are arranged alternately. In the light, emitting device Opc2, such a configuration lessens unevenness of arrangement of plural LED chips 11c. That is, the plural LED chips 11c are arranged in the portion between the first wiring pattern Pt1 and the second wiring pattern Pt2 in a well-balanced manner.

Further, in the light emitting device Opc2, unevenness of arrangement of plural LED chips 21c is lessened. That is, the plural LED chips 21c are arranged in the portion between the first wiring pattern Pt1 and the second wiring pattern Pt2 in a well-balanced manner.

That is, viewing the emitting device Opc2 illustrated in FIG. 11, the LED chips 11c and the LED chips 21c are arranged line-symmetrically or substantially line-symmetrically to the first line L1 that extends in the alignment direction of the first wiring pattern Pt1 and the second wiring pattern Pt2 and to the second line L2 that is orthogonal to the first line L1. That the LED chips 11c and the LED chips 21c are arranged line-symmetrically or substantially line-symmetrically to each of the two orthogonal lines (L1 and L2).

In the light emitting device Opc2, the plural LED chips 11c and the plural LED chips 21c are arranged in a state with low unevenness. Accordingly, unevenness of the beams of light emitted from the first light emitting unit 1c may be lessened. Further, unevenness of the beams of light emitted from the second light emitting unit 2c may be lessened.

Based on the above description, the light emitting device Opc2 of this modification example is used, and it is thereby possible to irradiate an irradiation target with the light in the first emission color and the light in the second emission color with low unevenness. Note that in the above-described light emitting units, the LED groups in which plural LEDs are connected in series in the forward direction are connected in parallel. However, embodiments are not limited to this. For example, in a case of a configuration that is capable of emitting light with sufficient beams, individual LEDs may be connected in parallel.

Fourth Embodiment

Figure 12:
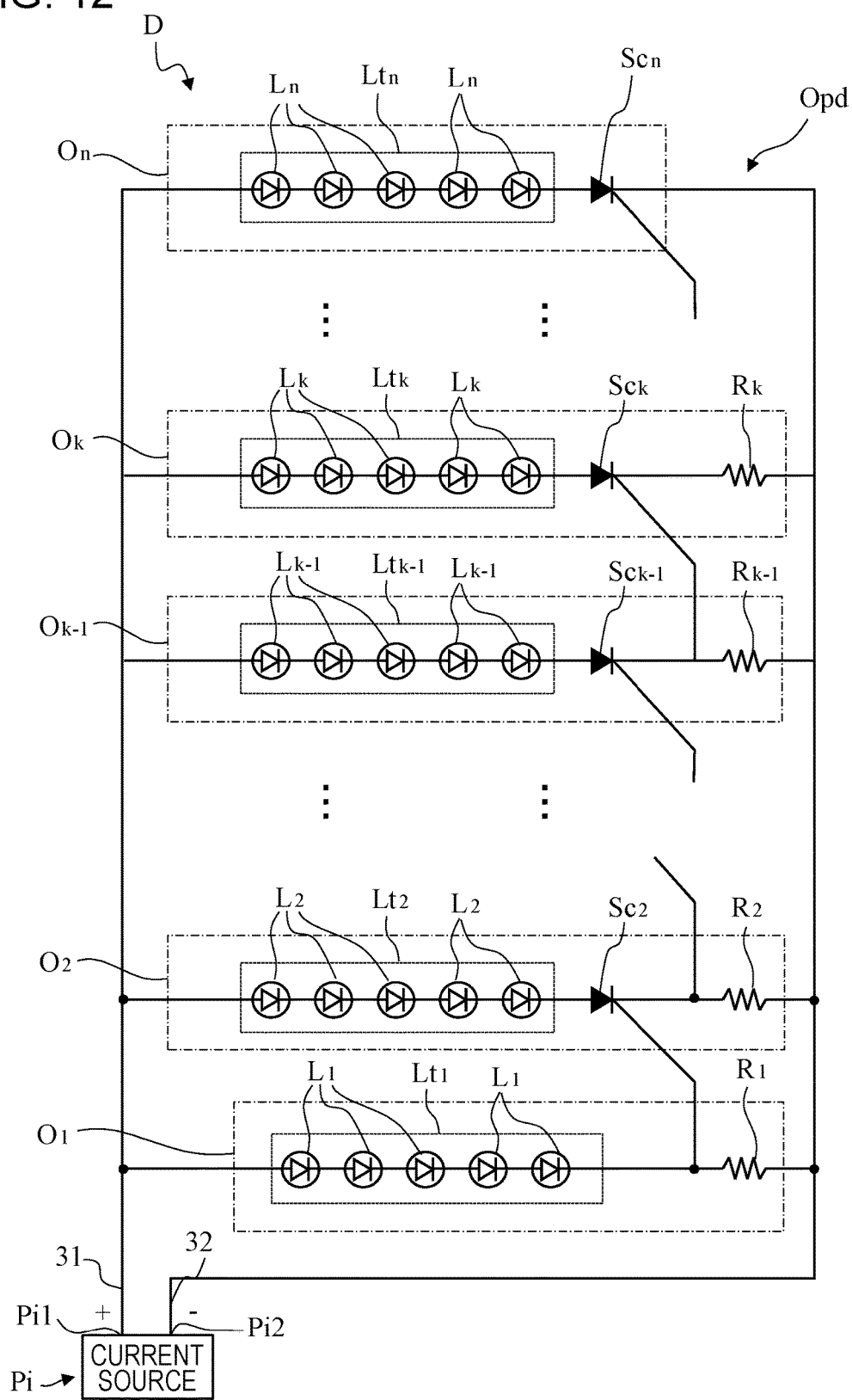
FIG. 12 is a diagram that illustrates yet another example of the illumination device according to the present invention.

Yet another example of the illumination device according to the present invention will be described with reference to the drawings. FIG. 12 is a diagram that illustrates yet another example of the illumination device according to the present invention. An illumination device D illustrated in FIG. 12 includes a light emitting device Opd that is capable of switching n (n≥3) emission colors and of performing dimming in each of the emission colors.

As illustrated in FIG. 12, the light emitting device Opd includes a first light emitting unit $O_1$ of a first emission color to an nth light emitting unit $O_n$ of an nth emission color. The first emitting unit O1 to the nth light emitting unit On are connected in parallel. In each of those, a positive electrode side is connected with the first connection terminal 31, and a negative electrode side is connected with the second connection terminal 32. The first light emitting unit $O_1$ includes a first LED group $Lt_1$ in which plural (here, five) LEDs $L_1$ of the first emission color are connected in series and a resistance $R_1$. Note that for convenience of description, the LED is denoted with $L_1$, the first LED group is denoted with $Lt_1$, and the resistance is denoted with $R_1$. However, those are the same as the LED 11, the first LED group 10, and the resistance 12, respectively.

Making a description about a kth light emitting unit $O_k$ that is the kth (k=2, 3, . . . , n−1) light emitting unit as an example, in the kth light emitting unit $O_k$, a kth LED group $Lt_k$ in which plural (here, five) LEDs $L_k$ of the kth emission color are connected in series, a thyristor $Sc_k$, and a resistance $R_k$ are connected in series. As for the thyristor $Sc_k$ of the kth light emitting unit $O_k$, an anode is connected with the kth LED group $Lt_k$, and a cathode is connected with the second connection terminal 3 via the resistance $R_k$. Further, a base terminal is connected with a terminal on a positive electrode side (in other words, a high voltage side) of a resistance $R_{k-1}$ of a k−1th light emitting unit $O_{k-1}$.

Moreover, in the nth light emitting unit $O_n$ that is the nth light emitting unit, an nth LED group $Lt_n$ in which plural (here, five) LEDs $L_n$ of the nth emission color are connected in series and a thyristor $Sc_n$ are connected in series. As for the thyristor $Sc_n$ of the nth light emitting unit $O_n$, the anode is connected with the nth LED group $Lt_n$, and the cathode is connected with the second connection terminal 32. Further, the base terminal is connected with the terminal on the positive electrode side (in other words, the high voltage side) of a resistance $R_{n-1}$ of an n−1th light emitting unit $O_{n-1}$.

A description will be made about a light emitting action of the illumination device D that includes this light emitting device Opd. In the light emitting device Opd in a state where power is not supplied, all thyristors are in the OFF state. In this state, when a higher voltage than a total forward voltage is applied to each LED group and power is supplied. Accordingly, a current first flows through the first LED group $Lt_1$ of the first light emitting unit $O_1$, and the five LEDs $L_1$ emit light. Accordingly, the light in the first emission color is emitted. In addition, the voltage of the resistance $R_1$ on the positive electrode side is expressed by the product of a resistance value $RL_1$ of the resistance $R_1$ and a flowing current value $IL_1$. When the voltage of the resistance $R_1$ on the positive electrode side is the gate voltage of a thyristor $Sc_2$ disposed for a second light emitting unit $O_2$ and the gate voltage exceeds a specific voltage, the thyristor $Sc_2$ is turned ON. That is, the current flows through a second LED group $Lt_2$.

The thyristor Sc2 is turned ON, and most of the current supplied from the current source Pi thereby flows through the second LED group $Lt_2$, and LEDs $L_2$ emit light. The current supplied from the current source Pi is changed in this state, and it is thereby possible to perform dimming in a second emission color. In addition, the current that flows through the second LED group $Lt_2$ flows through the resistance $R_2$, and the voltage of the resistance $R_2$ on the positive electrode side is expressed by the product of a resistance value $RL_2$ of the resistance $R_2$ and a flowing current value $IL_2$. In addition, the voltage of the resistance $R_2$ on the positive electrode side is the gate voltage of a thyristor $Sc_3$ of a third light emitting unit $O_3$. When the gate voltage exceeds a specific value, a thyristor $Sc_3$ is turned ON, the current flows through a third LED group $Lt_3$ of the third light emitting unit $O_3$, and LEDs $L_3$ emit light.

Note that in order to cause most of the current supplied from the current source Pi to flow through the light emitting unit that includes the thyristor when the concerned thyristor is turned ON, the total forward voltage of the LED group has to be higher than the LED group of the light emitting unit whose thyristor is turned ON immediately before the concerned thyristor. That is, given that the total forward voltage of the kth LED group $Lt_k$ of the kth light emitting unit $O_k$ is $SVf_{-k}$, the total forward voltage $SVf_{-k}$ of the kth LED group $Lt_k$ is decided such that the relationship of $SVf_{k-1} - SVf_k > Th_k$ holds. Note that the kth LED group $Lt_k$ is the LED group whose total forward voltage is the maximum among the LED groups whose total forward voltages are lower than a k−1th LED group $Lt_{k-1}$. In addition, $Th_k$ may be a value that varies in accordance with a variable k or may be a common value.

In such a configuration, the illumination device D is capable of emitting light in plural emission colors and of performing dimming in each of the emission colors.

In the above-described embodiments, the thyristor is used as the switching element. However, embodiments are not limited to this. For example, a gate turn off (GTO) thyristor may be used. The GTO thyristor causes a current to flow from a cathode to a gate, that is, makes the gate voltage lower than the cathode and may thereby stop the current that flows from an anode to the cathode. The GTO thyristor is used, and it thereby becomes possible to turn OFF the thyristor without stopping the current supplied from the current source and to perform more kinds of control. Note that in a case where the GTO thyristor is used, in addition to the above-described circuit that applies the voltage by using the resistance, a circuit, an element, or the like that applies a lower voltage than the cathode to the gate is included.

In the above-described embodiments, as a light emitting device, a substrate on which LEDs, a thyristor, and a resistance are mounted is described. However, a light emitting device is not limited to this. The light emitting device may include a configuration for connection with a separately prepared power source device (for example, a connector or the like). Moreover, the light emitting device may have configuration in which a substrate which includes the above-described circuit together with a heat dissipation tool or an optical tool such as a lens is incorporated in a housing. For example, the light emitting device is usable as a spotlight, a ceiling light, or an LED light bulb. That is, the light emitting device may be an apparatus on which LEDs are mounted and which is connected with a separately prepared power source and emits light by being supplied with power (current) from the power source.

In the foregoing, the embodiments of the present invention have been described. However, the present invention is not limited to those contents. Further, various modifications may be applied to the embodiments of the present invention without departing from the gist of the present invention.

A light emitting device according to the present invention, which is described in the foregoing, includes plural light emitting units in which at least one light emitting diode is disposed. The plural light emitting units respectively have different emission colors and forward voltages, the other light emitting units than the light emitting unit whose forward voltage is a maximum are provided with a switching element that is connected in series with the light emitting diode, and the other light emitting units than the light emitting unit whose forward voltage is a minimum are provided, on a negative electrode side, with a resistance that is connected in series with the light emitting diode. The switching element is an element that includes a first terminal, a second terminal, and a third terminal, causes the first terminal and the second terminal to turn into a conducting state by applying a prescribed voltage to the third terminal, and subsequently retains the conducting state in a case where a voltage of the third terminal is within a specific range. A terminal of the resistance on a positive electrode side is electrically connected with the third terminal of the switching element that is provided to the light emitting unit whose forward voltage is highest among the light emitting units whose forward voltages are lower than the light emitting unit that is provided with the resistance.

Consequently, the switching element is turned ON by changing the supplied current, light emission by the light emission units are thereby switched, and adjustment of the beams, that is, dimming is performed by fluctuating the current in a range in which the switching element is not turned ON. Then, after the switching element is turned ON, the switching element is not turned OFF unless current supply is stopped. Thus, the supplied current value is appropriately adjusted, and it is thereby possible to arbitrarily change the emission colors of light emission and to perform dimming in each of the emission colors. Accordingly, a control circuit for switching the light emission and dimming is not requested, and it is thereby possible to make the light emitting device have a simple configuration. In addition, the simple configuration enables size reduction and weight saving and enables costs to be lowered.

In the above-described light emitting device, at least one of the switching elements may be configured to include a thyristor. In such a configuration, one element may be used as the switching element, and it is thus possible to reduce a ground contact area and to increase the degree of freedom of wiring.

In the above-described light emitting device, at least one of the switching elements may include a PNP junction bipolar transistor and an NPN junction bipolar transistor, a base and a collector of the PNP junction bipolar transistor may respectively be connected with a collector and a base of the NPN junction bipolar transistor, an emitter terminal of the PNP junction bipolar transistor may be the first terminal, an emitter terminal of the NPN junction bipolar transistor may be the second terminal, and a base terminal of the NPN junction bipolar transistor may be the third terminal.

In the above-described light emitting device, at least one of the plural light emitting units may include a light emitting diode group in which plural light emitting diodes are connected in series, and the light emitting unit whose forward voltage is low may have a small number of emitting diodes that are connected in series in the light emitting diode group compared to the light emitting unit whose forward voltage is high. Because the forward voltage may be adjusted by the number of light emitting diodes, an element for adjusting the forward voltage is not requested.

In the above-described light emitting diode, at least one of the plural light emitting units may include the plural light emitting diode groups, and the plural light emitting diode groups may be connected in parallel. The number of light emitting diodes that are connected in series in the light emitting diode group and the number of the light emitting diode groups that are connected in parallel are adjusted, the number of light emitting diodes of each of the light emitting units may thereby be made the same number, and the forward voltage is adjustable.

In the above-described light emitting device, the light emitting unit that includes the plural light emitting diode groups may be dividedly arranged so as to include at least one of the light emitting diode groups, and at least one of the light emitting diode groups of the different light emitting unit may be arranged between the divided light emitting units. In such a manner, the light emitting unit is dividedly arranged as individual or plural light emitting diode groups, the light emitting diode group of the other light emitting unit is arranged between the divided light emitting units, and unevenness of arrangement of the light emitting diodes of the light emitting units may thereby be suppressed. Note that the light emitting unit may be divided into individual light emitting diode groups, and between those, the light emitting diode group of the different light emitting unit may thereby be arranged. The light emitting unit may be divided so as to include plural light emitting diode groups, and between those, individual or plural light emitting diode groups of the different light emitting unit may thereby be arranged.

In the above-described light emitting device, each of the plural light emitting units includes the light emitting diode group in which a same number of light emitting diodes are connected in series, at least one of the light emitting diode groups includes one or plural diodes that are connected in series with the light emitting diode, and the light emitting unit whose forward voltage is high has a large number of the connected diodes compared to the light emitting unit whose forward voltage is low. Consequently, the number of light emitting diodes of each of the light emitting units is made the same number, and the forward voltage may thereby be changed with the same or substantially same beam amount. Thus, it becomes possible to switch the emission colors and to perform dimming in each of the emission colors in a simple configuration.

In the above-described light emitting device, at least one of the resistances may have a characteristic in which a resistance value becomes low in response to a temperature rise. In such a configuration, in a case where the voltage value at which the switching element is turned ON becomes low due to the temperature rise, the change in the voltage value due to the current may likewise be made small. Accordingly, the fluctuation in the current value at which the switching element is turned ON may be suppressed even if the temperature changes, and it is possible to make the width of dimming in each of the emission colors the same or substantially same.

The above-described light emitting device may include: a substrate on which the plural light emitting units, the switching element, and the resistance are mounted; and land units that are respectively connected with positive electrode sides and negative electrode sides of the plural light emitting units. In such a manner, an integrated configuration in one substrate enables size reduction.

REFERENCE SIGNS LIST

A to D illumination device
Op, Opb, Opc, Opd light emitting device
1 first light emitting unit
10 first LED group
101 positive electrode terminal
102 negative electrode terminal
11 LED
11$c$ LED chip
12 resistance
2 second light emitting unit
20 second LED group
201 positive electrode terminal
202 negative electrode terminal
21 LED
21$c$ LED chip
22 thyristor
221 anode
222 cathode
223 gate 31 first connection terminal
32 second connection terminal
Bd substrate
Ph printed wiring
Ph1 first path
Ph2 second path
Bd substrate
Pt1 first wiring pattern
Pt2 second wiring pattern
Pt3 third wiring pattern
Ld1 first land unit
Ld2 second land unit
Cv1 first sealing unit
Cv2 second sealing unit
Pi current source (power source)
Pi1 positive electrode
Pi2 negative electrode

The invention claimed is:

1. A light emitting device comprising:
plural light emitting units in which at least one light emitting diode is disposed, wherein
the plural light emitting units respectively have different emission colors and forward voltages,
the light emitting units other than the light emitting unit whose forward voltage is a maximum are provided with a switching element that is connected in series with the light emitting diode,
the light emitting units other than the light emitting unit whose forward voltage is a minimum are provided, on a negative electrode side, with an element that is connected in series with the light emitting diode and has a resistance,
the switching element is an element that includes a first terminal, a second terminal, and a third terminal, causes the first terminal and the second terminal to turn into a conducting state by applying a prescribed voltage to the third terminal, and subsequently retains the conducting state in a case where a voltage of the third terminal is within a specific range, and
a terminal on a positive electrode side of the element that has the resistance is electrically connected with the third terminal of the switching element that is provided to the light emitting unit whose forward voltage is highest among the light emitting units whose forward voltages are lower than the light emitting unit that is provided with the element which has the resistance, wherein
at least one of the elements that have the resistance has a characteristic in which a resistance value becomes low in response to a temperature rise.

2. The light emitting device according to claim 1, wherein at least one of the switching elements includes a thyristor.

3. The light emitting device according to claim 1, wherein
at least one of the switching elements includes a PNP junction bipolar transistor and an NPN junction bipolar transistor,
a base and a collector of the PNP junction bipolar transistor are respectively connected with a collector and a base of the NPN junction bipolar transistor, and
an emitter terminal of the PNP junction bipolar transistor is the first terminal, an emitter terminal of the NPN junction bipolar transistor is the second terminal, and a base terminal of the NPN junction bipolar transistor is the third terminal.

4. The light emitting device according to claim 1, wherein
at least one of the plural light emitting units includes a light emitting diode group in which plural light emitting diodes are connected in series, and
the light emitting unit whose forward voltage is low has a small number of light emitting diodes that are connected in series in the light emitting diode group compared to the light emitting unit whose forward voltage is high.

5. The light emitting device according to claim 4, wherein
at least one of the plural light emitting units includes the plural light emitting diode groups, and
the plural light emitting diode groups are connected in parallel.

6. The light emitting device according to claim 5, wherein
the light emitting unit that includes the plural light emitting diode groups is dividedly arranged so as to include at least one of the light emitting diode groups, and
at least one of the light emitting diode groups of the different light emitting unit is arranged between the divided light emitting units.

7. The light emitting device according to claim 1, wherein
each of the plural light emitting units includes the light emitting diode group in which a same number of light emitting diodes are connected in series,
at least one of the light emitting diode groups includes one or plural diodes that are connected in series with the light emitting diode, and
the light emitting unit whose forward voltage is high has a large number of the connected diodes compared to the light emitting unit whose forward voltage is low.

8. The light emitting device according to claim 1, comprising:
a substrate on which the plural light emitting units, the switching element, and the element which has the resistance are mounted; and
land units that are respectively connected with positive electrode sides and negative electrode sides of the plural light emitting units.

9. An illumination device comprising:
the light emitting device according to claim 1; and
a power source that supplies a current to the light emitting device.

* * * * *